US011216338B2

(12) United States Patent
Hwang et al.

(10) Patent No.: US 11,216,338 B2
(45) Date of Patent: Jan. 4, 2022

(54) STORAGE DEVICE THAT PERFORMS STATE SHAPING OF DATA

(71) Applicant: SAMSUNG ELECTRONICS CO., LTD., Suwon-si (KR)

(72) Inventors: Youngjun Hwang, Hwaseong-si (KR); Dong-Min Shin, Seoul (KR); Changkyu Seol, Osan-si (KR); Jaeyong Son, Hwaseong-si (KR); Hong Rak Son, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/835,721

(22) Filed: Mar. 31, 2020

(65) Prior Publication Data

US 2021/0026734 A1 Jan. 28, 2021

(30) Foreign Application Priority Data

Jul. 24, 2019 (KR) .......................... 10-2019-0089640

(51) Int. Cl.
*G06F 11/10* (2006.01)
*G11C 16/26* (2006.01)
*G11C 16/10* (2006.01)

(52) U.S. Cl.
CPC .......... *G06F 11/1068* (2013.01); *G11C 16/10* (2013.01); *G11C 16/26* (2013.01)

(58) Field of Classification Search
CPC ........ G11C 11/5642; G11C 2029/0411; G11C 16/10; G11C 29/42; G11C 29/52; G11C 16/26; G11C 11/5628; G06F 11/1068
See application file for complete search history.

(56) References Cited

U.S. PATENT DOCUMENTS

| 4,442,487 | A | * | 4/1984 | Fletcher ............. G06F 12/0888 711/122 |
| 8,762,823 | B2 | | 6/2014 | Yang |
| 8,782,329 | B2 | | 7/2014 | Yang |
| 8,874,994 | B2 | | 10/2014 | Sharon et al. |
| 8,996,947 | B2 | | 3/2015 | Chung et al. |
| 9,032,278 | B2 | | 5/2015 | Yang |
| 9,135,155 | B2 | | 9/2015 | Sharon et al. |
| 9,524,794 | B1 | | 12/2016 | Shapira |
| 10,114,549 | B2 | | 10/2018 | Alrod et al. |
| 2010/0223530 | A1 | | 9/2010 | Son et al. |
| 2011/0141833 | A1 | | 6/2011 | Hains et al. |

(Continued)

*Primary Examiner* — Guy J Lamarre
(74) *Attorney, Agent, or Firm* — Volentine, Whitt & Francos, PLLC

(57) ABSTRACT

A storage device includes a nonvolatile memory device that includes a plurality of pages, each of which includes a plurality of memory cells, and a controller that receives first write data expressed by $2^m$ states (m being an integer greater than 1) from an external host device. The controller in a first operating mode shapes the first write data to second write data, which are expressed by "k" states (k being an integer greater than 2) smaller in number than the $2^m$ states, performs first error correction encoding on the second write data to generate third write data expressed by the "k" states, and transmits the third write data to the nonvolatile memory device for writing at a selected page from the plurality of pages.

19 Claims, 21 Drawing Sheets

(56) References Cited

U.S. PATENT DOCUMENTS

| | | |
|---|---|---|
| 2011/0238903 A1 | 9/2011 | Ban |
| 2013/0054876 A1 | 2/2013 | Varanasi |
| 2013/0191579 A1 | 7/2013 | Sharon et al. |
| 2013/0294159 A1* | 11/2013 | Bauer .................. G11C 11/5628 365/185.03 |
| 2014/0059406 A1* | 2/2014 | Hyun .................. G11C 11/5621 714/773 |
| 2016/0011807 A1* | 1/2016 | Seol ....................... G11C 16/10 711/102 |
| 2016/0087646 A1 | 3/2016 | Motwani et al. |
| 2016/0211014 A1* | 7/2016 | Lee ...................... G11C 11/5628 |

\* cited by examiner

FIG. 7
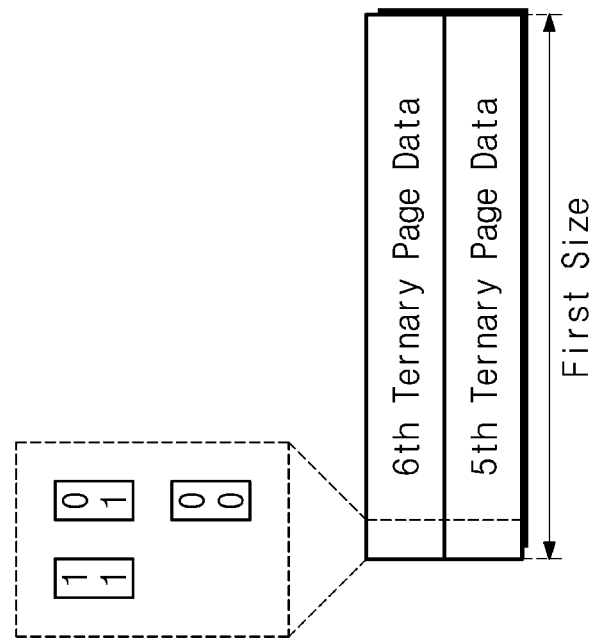
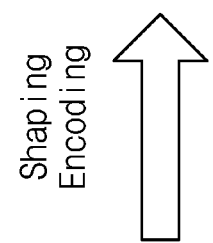
Shaping Encoding
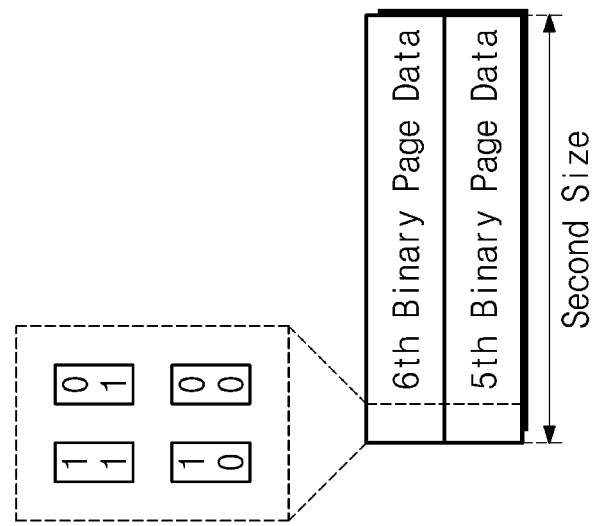

| + | 0 | 1 | 2 |
|---|---|---|---|
| 0 | 0 | 1 | 2 |
| 1 | 1 | 2 | 0 |
| 2 | 2 | 0 | 1 |

OP2

| × | 0 | 1 | 2 |
|---|---|---|---|
| 0 | 0 | 0 | 0 |
| 1 | 0 | 1 | 2 |
| 2 | 0 | 2 | 1 |

STORAGE DEVICE THAT PERFORMS STATE SHAPING OF DATA

CROSS-REFERENCE TO RELATED APPLICATIONS

A claim of priority under 35 U.S.C. § 119 is made to Korean Patent Application No. 10-2019-0089640 filed on Jul. 24, 2019, in the Korean Intellectual Property Office, the entirety of which is hereby incorporated by reference.

BACKGROUND

The present inventive concepts herein relate to semiconductor devices, and more particularly to storage devices that achieve improved reliability through state shaping.

Nonvolatile memory devices used for data storage include for example flash memory, phase-change memory, variable resistance memory, ferroelectric memory, magnetic memory, and resistive memory, to name a few. Data is stored therein in the form of binary bits.

A binary bit has one of two values: "0" and "1". That is, a single binary bit may indicate or have two states. A pair of binary bits taken together may have one of four values: "00", "01", "10", and "11". In general, when "m" bits (m being a positive integer) are written in one memory cell, the one memory cell may have one of $2^m$ (i.e., $2^m$) states.

That is, "m" binary bits may indicate or express m states, and a memory cell that stores m bits may have $2^m$ states. As the number of bits stored in one memory cell increases, the number of states expressed by the one memory cell exponentially increases. However, as the number of states expressed by a memory cell increases, it becomes increasingly difficult to identify $2^m$ states independently and to write data in memory cells robustly.

SUMMARY

Embodiments of the inventive concepts provide a storage device securing improved reliability while increasing the number of bits to be written in one memory cell.

Embodiments of the inventive concepts provide a storage device including a nonvolatile memory device that includes a plurality of pages, each of the plurality of pages including a plurality of memory cells; and a controller. The controller receives first write data expressed by $2^m$ states from an external host device, wherein m is an integer greater than 1; shapes the first write data to second write data in a first operating mode, wherein the second write data are expressed by "k" states smaller in number than the $2^m$ states and wherein k is an integer greater than 2; performs first error correction encoding on the second write data to generate third write data expressed by the "k" states; and transmits the third write data to the nonvolatile memory device for writing at a selected page from the plurality of pages.

Embodiments of the inventive concepts further provides a storage device including a nonvolatile memory device that includes a plurality of pages, each of the plurality of pages including a plurality of memory cells; and a controller. The controller receives a read request from an external host device; reads first read data expressed by "k" states from a selected page from the plurality of pages of the nonvolatile memory device in response to the read request, wherein k is an integer greater than 2; performs error correction decoding on the first read data to generate second read data expressed by the "k" states; shapes the second read data to third read data expressed by $2^m$ states greater in number than the "k" states, wherein m is an integer greater than 1; and outputs the third read data to the external host device.

Embodiments of the inventive concepts still further provide a storage device including a nonvolatile memory device that includes a plurality of pages, each of the plurality of pages including a plurality of memory cells, and a controller. The controller includes a host interface that receives first to sixth page data from an external host device; a buffer that stores the first to sixth page data transmitted from the host interface; a binary error correction encoder that respectively performs error correction encoding on the first to fourth page data stored in the buffer to generate first to fourth encoded page data; a shaping encoder that shapes the fifth and sixth page data stored in the buffer to ternary data; a ternary error correction encoder that performs ternary error correction encoding on the ternary data to generate ternary encoded data; and a memory interface that transmits the first to fourth encoded page data and the ternary encoded data to the nonvolatile memory device. The nonvolatile memory device writes the first to fourth encoded page data and the ternary encoded data at a selected page from the plurality of pages.

Embodiments of the inventive concepts also provide a storage device including a nonvolatile memory device that includes a plurality of pages, each of the plurality of pages including a plurality of memory cells, and a controller. The controller in a first operation mode receives page data from an external host device; performs binary error correction encoding on a first portion of the page data to generate binary encoded data; shapes a second portion of the page data to generate n-ary data; perform n-ary error correction encoding on the n-ary data to generate n-ary encoded data; and transmits the binary encoded data and the n-ary encoded data to the nonvolatile memory device for storage. The nonvolatile memory device writes the transmitted binary encoded data and the transmitted n-ary encoded data at a selected page from among the plurality of pages, and n is an integer greater than 2.

BRIEF DESCRIPTION OF THE FIGURES

The above and other objects and features of the inventive concepts will become apparent in view of the following detailed description of exemplary embodiments as taken with reference to the accompanying drawings.

FIG. 7 illustrates an example descriptive of how a shaping encoder performs state shaping according to embodiments of the inventive concepts.

FIG. 19 illustrates an example of operators defined in a Galois field of a ternary number.

DETAILED DESCRIPTION

Hereinafter embodiments of the inventive concepts are described in detail and clearly to such an extent that one of ordinary skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
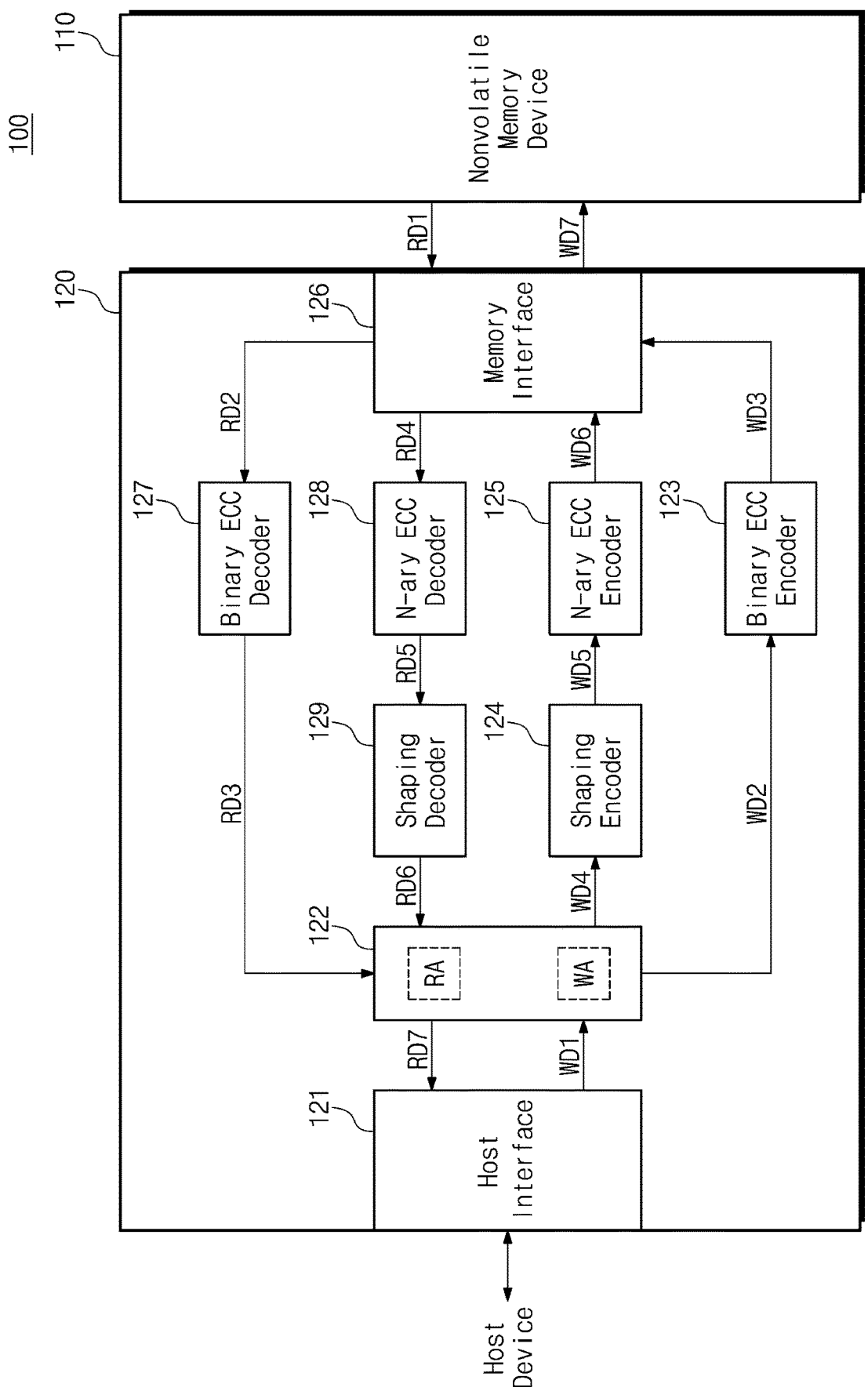
FIG. 1 illustrates a block diagram of a storage device according to an embodiment of the inventive concepts.

FIG. 1 illustrates a block diagram of a storage device 100 according to an embodiment of the inventive concepts. Referring to FIG. 1, the storage device 100 may include a nonvolatile memory device 110 and a controller 120. The nonvolatile memory device 110 may include nonvolatile memory such as for example flash memory, phase-change memory, variable resistance memory, ferroelectric memory, magnetic memory, or resistive memory, among other types of nonvolatile memory.

The controller 120 may control the nonvolatile memory device 110 depending on a request of an external host device or an internally designated schedule. For example, the controller 120 may control a write operation, a read operation, and an erase operation of the nonvolatile memory device 110.

The controller 120 may include a host interface 121, a buffer 122, a binary error correction code (ECC) encoder 123, a shaping encoder 124, an n-ary ECC encoder 125 (n being an integer greater than 2), a memory interface 126, a binary ECC decoder 127, an n-ary ECC decoder 128, and a shaping decoder 129.

The host interface 121 may communicate with the external host device. The host interface 121 may exchange signals with the external host device in compliance with a given protocol. The host interface 121 may receive various requests from the external host device. The host interface 121 may exchange data with the external host device.

The buffer 122 may include a write area WA that stores first write data WD1 received from the host interface 121. When the amount of data accumulated in the write area WA reaches a unit of the write operation of the nonvolatile memory device 110, the data accumulated in the write area WA may be written in the nonvolatile memory device 110.

For example, a portion of the data accumulated in the write area WA may be provided to the binary ECC encoder 123 as second write data WD2. The binary ECC encoder 123 may perform binary error correction encoding on the second write data WD2.

The binary ECC encoder 123 may generate third write data WD3 by adding a parity generated through the binary error correction encoding to the second write data WD2. That is, the amount of data in the third write data WD3 may be greater than the amount of data in the second write data WD2. The third write data WD3 may be provided to the memory interface 126.

The remaining portion of the data accumulated in the write area WA may be provided to the shaping encoder 124 as fourth write data WD4. The shaping encoder 124 may perform state shaping encoding on the fourth write data WD4.

The state shaping encoding may decrease the number of states to be expressed by the fourth write data WD4 to generate fifth write data WD5. The state shaping encoding may shape the fourth write data WD4 expressed by binary bits to the fifth write data WD5 expressed by n-ary bits. The data in the fifth write data WD5 may be greater in amount than the data in the fourth write data WD4.

The n-ary ECC encoder 125 may receive the fifth write data WD5 from the shaping encoder 124. The n-ary ECC encoder 125 may perform n-ary error correction encoding on the fifth write data WD5.

The n-ary ECC encoder 125 may generate sixth write data WD6 by adding a parity generated through the n-ary error correction encoding to the fifth write data WD5. That is, the data in the sixth write data WD6 may be greater in amount than the data in the fifth write data WD5. The sixth write data WD6 may be provided to the memory interface 126.

The memory interface 126 may provide the nonvolatile memory device 110 with the third write data WD3, the sixth write data WD6, or a combination of the third write data WD3 and the sixth write data WD6, as seventh write data WD7. The memory interface 126 may transmit a write command to the nonvolatile memory device 110 to cause the write operation of the seventh write data WD7.

Also, the memory interface 126 may transmit a read command to the nonvolatile memory device 110 to cause a read operation. The memory interface 126 may receive first read data RD1 from the nonvolatile memory device 110.

A portion of the first read data RD received through the memory interface 126 may be provided to the binary ECC decoder 127 as second read data RD2. The binary ECC decoder 127 may perform error correction decoding on the second read data RD2.

The binary ECC decoder 127 may eliminate a parity from the error-corrected data to generate (or restore) third read data RD3. The binary ECC decoder 127 may store the third read data RD3 in a read area RA of the buffer 122.

The remaining portion of the first read data RD1 received through the memory interface 126 may be provided to the n-ary ECC decoder 128 as fourth read data RD4. The n-ary ECC decoder 128 may perform error correction decoding on the fourth read data RD4 to correct an error(s).

The n-ary ECC decoder 128 may eliminate a parity from the error-corrected data to generate (or restore) fifth read data RD5. The n-ary ECC decoder 128 may transfer the fifth read data RD5 to the shaping decoder 129. The shaping decoder may perform state shaping decoding on the fifth read data RD5.

The state shaping decoding may increase the number of states to be expressed by the fifth read data RD5 to generate sixth read data RD6. The state shaping decoding may de-shape the fifth read data RD5 expressed by n-ary bits to the sixth read data RD6 expressed by binary bits. The data in the sixth read data RD6 may be smaller in amount than the data in the fifth read data RD5. The state shaping decoder 129 may store the sixth read data RD6 in the read area RA of the buffer 122.

When data requested by the external host device are accumulated in the read area RA or when data corresponding to an exchange unit for exchanging data with the external host device are accumulated in the read area RA, the data accumulated in the read area RA may be transmitted to the external host device through the host interface 121 as seventh read data RD7.

In an embodiment, the shaping encoder 124 and the shaping decoder 129 may perform shaping with reference to a table storing mapping information between input data and output data. The table may be stored in the controller 120, or the table may be stored in the nonvolatile memory device 110 and may be loaded onto the controller 120.

Although various blocks are illustrated in FIG. 1 as components for describing the technical idea of the inventive concepts, various other components may be added. For example, various storage devices such as first-input first-output (FIFO) circuits, flip-flops (FF), and registers may be disposed in the middle of a path(s) illustrated inside the controller 120 of FIG. 1.

Figure 2:
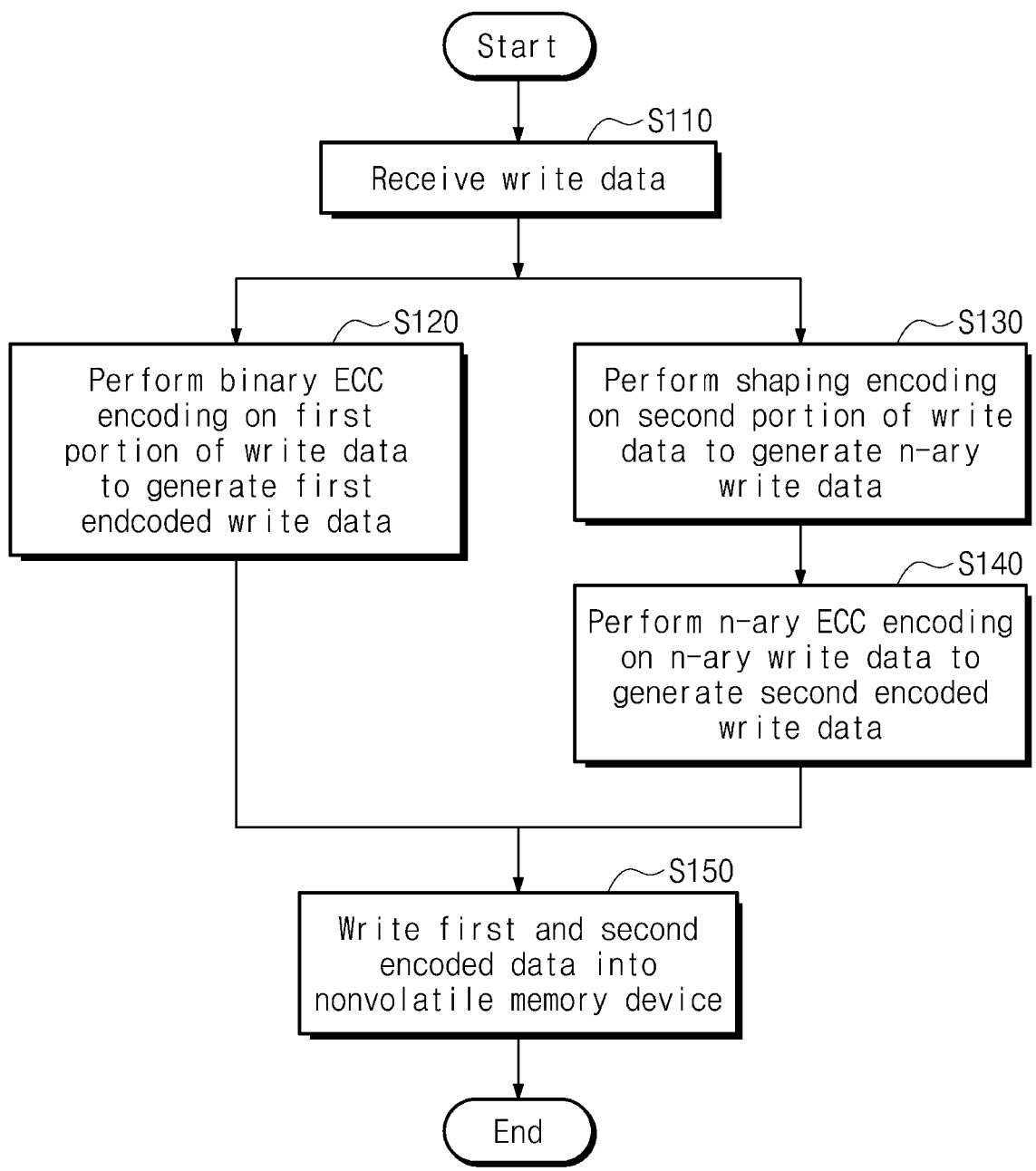
FIG. 2 illustrates a flowchart descriptive of an example of how the storage device of FIG. 1 performs a write operation.

FIG. 2 illustrates a flowchart descriptive of an example of how the storage device 100 of FIG. 1 performs a write operation. Referring to FIGS. 1 and 2, in operation S110, the controller 120 receives write data from an external host device. For example, the write data may be stored in the write area WA of the buffer 122.

When the data accumulated in the write area WA reaches a threshold (e.g., a unit of write operation of the nonvolatile memory device 110), the storage device 100 performs operation S120 and operation S130. In operation S120, the binary ECC encoder 123 performs binary ECC encoding on a first portion (e.g., WD2) of the write data and generates first encoded data (e.g., WD3).

In operation S130, the shaping encoder 124 performs shaping encoding on a second portion (e.g., WD4) of the write data and generates n-ary write data (e.g., WD5). In operation S140, the n-ary ECC encoder 125 performs n-ary ECC encoding on the n-ary write data (e.g., WD5) and generates second encoded data (e.g., WD6).

In an embodiment, operation S120, operation S130, and operation S140 may be performed at the same time. In operation S150, the memory interface 126 transmits the first encoded data (e.g., WD3) and the second encoded data (e.g., WD6) to the nonvolatile memory device 110 so as to be written therein.

According to an embodiment of the inventive concepts, the storage device 100 may perform the state shaping on a portion of write data. The number of states to which memory cells are programmed may decrease by performing the state shaping. The state shaping will be further described below.

Figure 3:
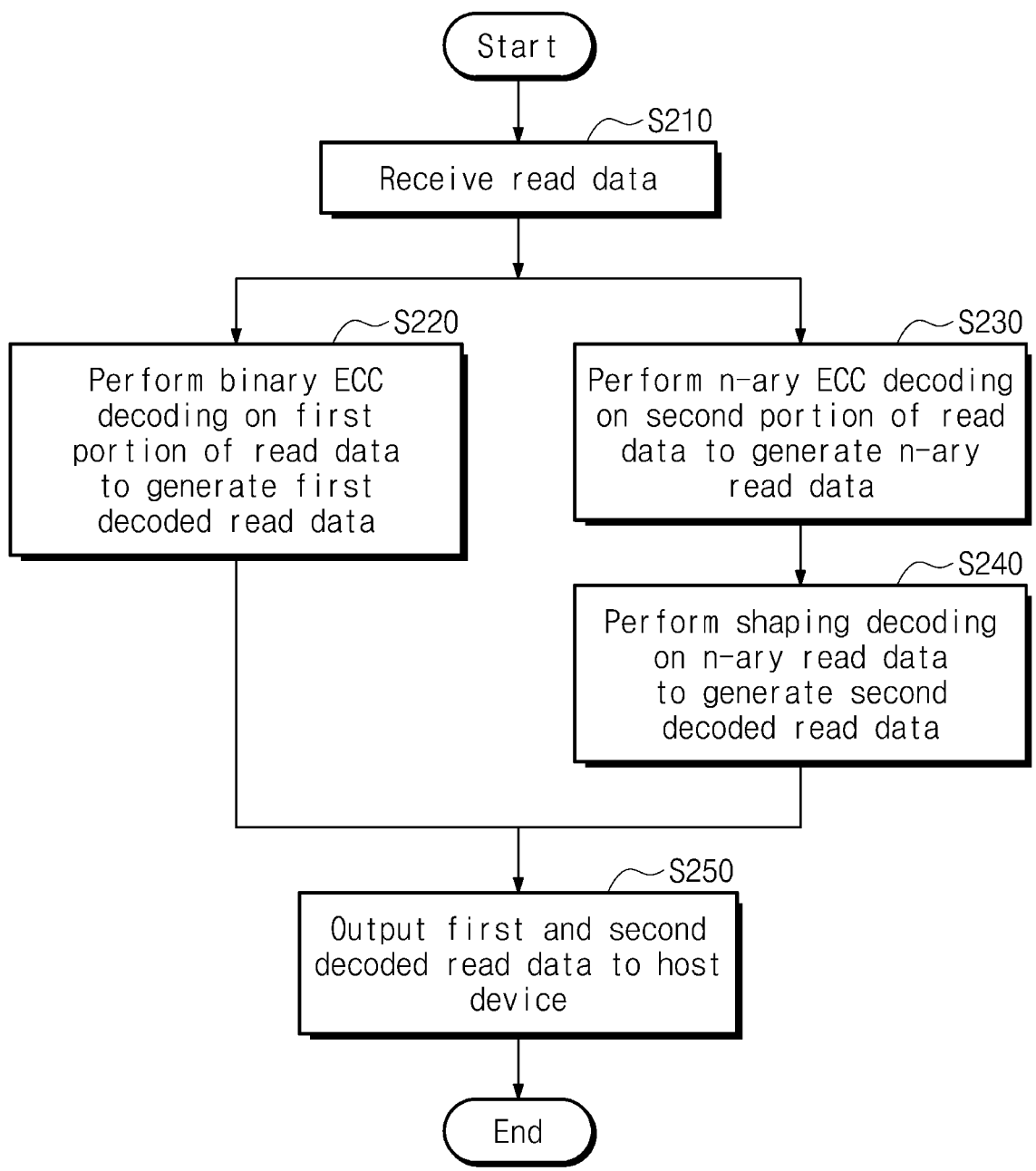
FIG. 3 illustrates a flowchart descriptive of an example of how the storage device of FIG. 1 performs a read operation.

FIG. 3 illustrates a flowchart descriptive of an example of how the storage device 100 of FIG. 1 performs a read operation. Referring to FIGS. 1 and 3, in operation S210, the memory interface 126 receives read data (e.g., RD1) from the nonvolatile memory device 110.

In operation S220, the binary ECC decoder 127 performs binary ECC decoding on a first portion (e.g., RD2) of the read data (e.g., RD1) and generates first decoded read data (e.g., RD3).

In operation S230, the n-ary ECC decoder 128 performs n-ary ECC decoding on a second portion (e.g., RD4) of the read data (e.g., RD1) and generates n-ary read data (e.g., RD5). In operation S240, the shaping decoder 129 performs shaping decoding on the n-ary read data (e.g., RD5) and generates second decoded read data (e.g., RD6).

In an embodiment, operation S220, operation S230, and operation S240 may be performed at the same time. In operation S250, the buffer 122 outputs the first decoded read data (e.g., RD3) and the second decoded read data (e.g., RD6) to the external host device (e.g., RD7) through the host interface 121.

Figure 4:
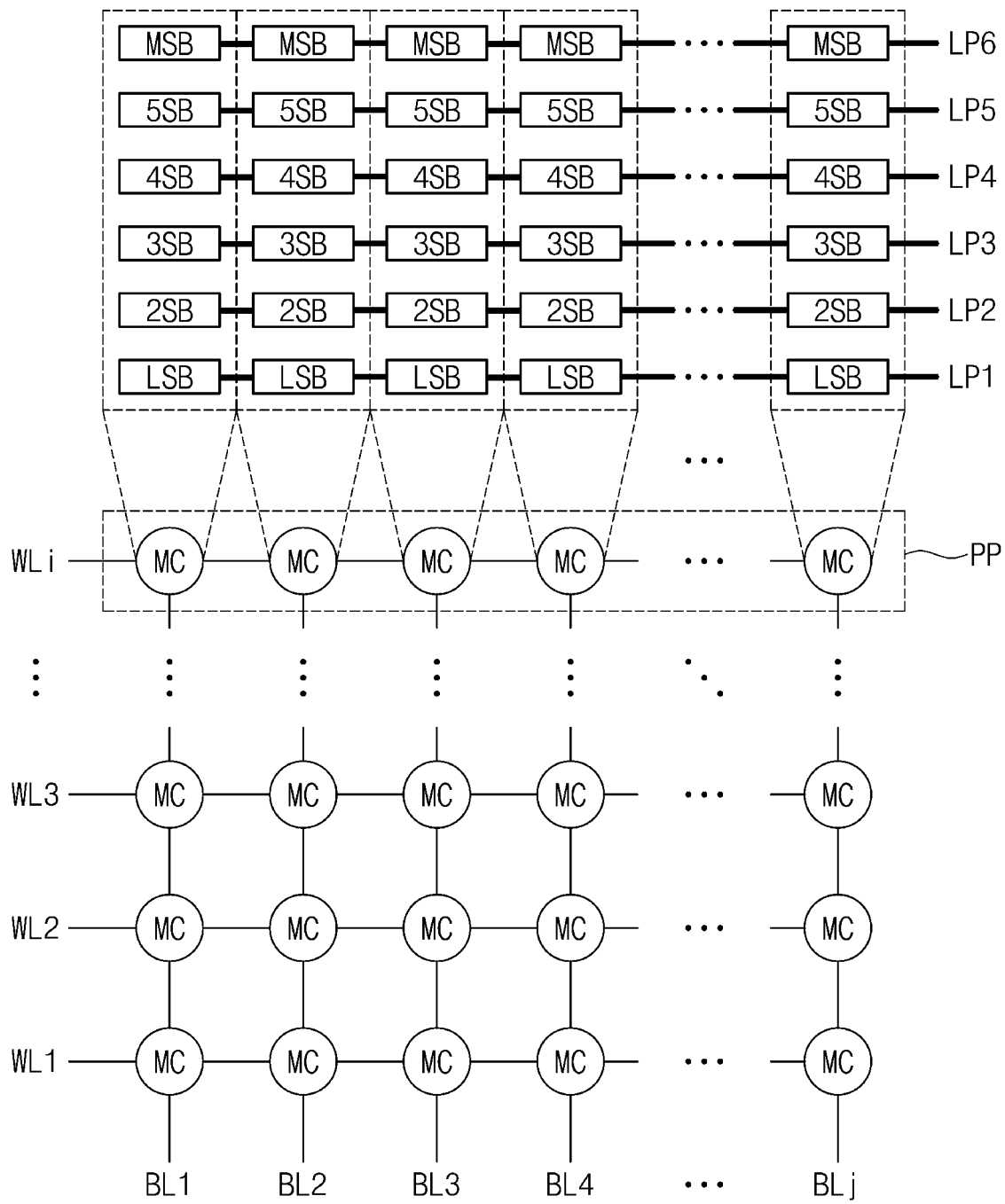
FIG. 4 illustrates an example of data written in memory cells of a nonvolatile memory device.

FIG. 4 illustrates an example of data written in memory cells MC of the nonvolatile memory device 110. Referring to FIGS. 1 and 4, the memory cells MC may be arranged in rows and columns. Each row of the memory cells MC are connected to a different word line. The rows of the memory cells MC may be respectively connected to first to i-th word lines WL1 to WLi. Each column of the memory cells MC are connected to a different bit line. The columns of the memory cells MC may be respectively connected to first to j-th bit lines BL1 to BLj.

A simplified connection relationship is illustrated in FIG. 4. The memory cells MC may however be connected to the first to i-th word lines WL1 to WLi and/or the first to j-th bit lines BL1 to BLj through any other components. Also, additional lines for accessing the memory cells MC, such as source lines or selection lines, may be connected to the memory cells MC.

The memory cells MC connected to one word line (e.g., WLi) may form one physical page PP. The read operation and the write operation are performed in the unit of a physical page PP. For example, data may be simultaneously written in the memory cells MC of the physical page PP during a write operation, and data may be simultaneously read from the memory cells MC of the physical page PP during a read operation.

A single memory cell MC may store two or more bits. For example, as shown a single memory cell MC may store a least significant bit (LSB), a 2nd significant bit (2SB), a 3rd significant bit (3SB), a 4th significant bit (4SB), a 5th significant bit (5SB), and a most significant bit (MSB).

Bits of a single physical page PP, which are written in the memory cells in the same order, may form a logical page. For example, as shown LSBs of the memory cells MC of the physical page PP may form a first logical page LP1. 2SBs of the memory cells MC of the physical page PP may form a second logical page LP2. 3SBs of the memory cells MC of the physical page PP may form a third logical page LP3. 4SBs of the memory cells MC of the physical page PP may form a fourth logical page LP4. 5SBs of the memory cells MC of the physical page PP may form a fifth logical page LP5. MSBs of the memory cells MC of the physical page PP may form a sixth logical page LP6.

One bit (e.g., an LSB) written in one memory cell MC has one of "0" or "1" values. That is, the LSBs are expressed by two states at the memory cells MC. Also, the 2SBs are expressed by two states at the memory cells MC. Accordingly, a combination of the LSBs and the 2SBs are expressed by 4 (2×2) states at the memory cells MC.

A combination of the LSBs, the 2SBs, and the 3SBs are expressed by 8 (2×2×2) states at the memory cells MC. Likewise, a combination of the LSBs, the 2SBs, the 3SBs, 4SBs, the 5SBs, and the MSBs are expressed by 64 (2×2×2×2×2×2) states at the memory cells MC.

Figure 5:
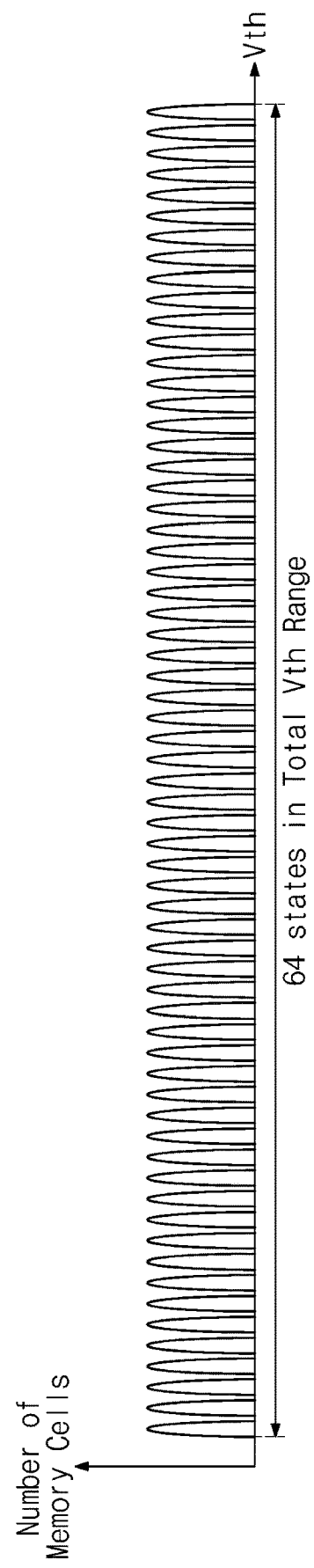
FIG. 5 illustrates an example of 64 states that memory cells may have.

FIG. 5 illustrates an example of 64 states that memory cells MC may have. In FIG. 5, a horizontal axis represents threshold voltages of the memory cells MC, and a vertical axis represents the number of memory cells MC. Referring to FIGS. 4 and 5, the memory cells MC may belong to different threshold voltage ranges and may be distinguished as having different states.

That is, 64 states (i.e., $2^m$ (or equivalently $2^m$) states) of the memory cells MC are expressed as 64 different threshold voltage ranges in the total Vth range. During the write operation, each of the memory cells MC may be controlled to have a threshold voltage belonging to one of the 64 threshold voltage ranges (or states).

The read operation may be performed by detecting whether a current flows through memory cells when a voltage between threshold voltage ranges is applied to the memory cells. For example, memory cells that are turned on when a particular voltage applied thereto may be determined as having threshold voltages lower than the particular voltage. For example, memory cells that are turned off when a particular voltage applied thereto may be determined as having threshold voltages higher than the particular voltage.

For example, 63 read voltages may be used to determine the 64 states independently of each other. A distance between the 64 states (or threshold voltage ranges) may act as a read margin. As a distance between states becomes greater, the read operation may be performed without error even though a read voltage may vary or threshold voltages of the memory cells MC may vary.

As the threshold voltages of the memory cells MC become higher, in the write operation, the read operation, or any other time, the memory cells MC internally experience stress and apply stress to each other. Accordingly, the total threshold voltage range may be limited so that excessive stress does not occur.

In the case where the total threshold voltage range is limited, an individual threshold voltage range (or an individual state) is limited, and a distance between threshold voltage ranges (or states) is also limited. This limitation frequently causes errors of the data in the memory cells MC and acts as the greatest obstacle to increasing the number of bits to be written in one memory cell.

The storage device 100 according to embodiments of the inventive concepts may shape at least a portion of data to a format different from a binary format such that the shaped data are written in the memory cells MC with states, the number of which is less than 64. Accordingly, the occurrence of error of data of the memory cells MC is suppressed, and thus, the reliability of stored data is secured even though there is increased number of bits to be written in one memory cell.

The description is given with reference to FIGS. 4 and 5 wherein a memory cell has one of 64 states. However, the technical idea of the inventive concepts is not limited to memory cells programmable to have 64 states. Moreover, examples where states are expressed by using threshold voltage ranges of the memory cells MC are described with reference to FIG. 5. However, the states are not limited to threshold voltage ranges. For example, the states may be expressed by ranges of resistance values.

Figure 6:
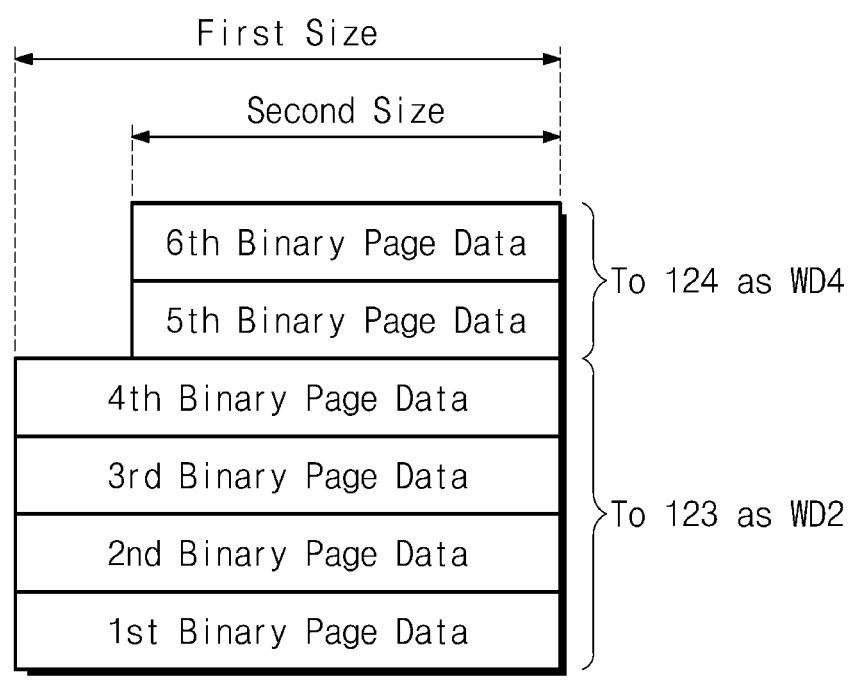
FIG. 6 illustrates an example of data accumulated in a write area that reaches a threshold.

FIG. 6 illustrates an example of data accumulated in the write area WA that reaches a threshold (e.g., a unit of a write operation of the nonvolatile memory device 110). Referring to FIGS. 1, 4, and 6, when first to sixth binary page data are stored in the write area WA, the amount of data stored in the write area WA may reach a threshold.

The first to fourth binary page data may have a first size. The first size may correspond to a size of one logical page. The first to fourth binary page data may be provided to the binary ECC encoder 123 as the second write data WD2. The binary ECC encoder 123 may perform error correction encoding on the first to fourth binary page data to add a parity.

The first to fourth binary page data thus ECC encoded may be provided to the memory interface 126 as the third write data WD3. For example, the number of bits of each of the first to fourth binary page data thus ECC encoded may be identical to the number of memory cells MC of the physical page PP, for example, the number of memory cells designated to store user data except for meta, monitor, or spare memory cells.

The fifth and sixth binary data may have a second size. The second size may be smaller than the first size. The fifth and sixth binary data may be provided to the shaping encoder 124 as the fourth write data WD4.

The first to sixth binary page data may be written in one physical page PP of the nonvolatile memory device 110. That is, 6 bits corresponding to the first to sixth binary page data may be written in one memory cell. As described with reference to FIGS. 4 and 5, the first to sixth binary page data may be expressed by 64 states.

FIG. 7 illustrates an example descriptive of how the shaping encoder 124 performs state shaping according to embodiments of the inventive concepts. Referring to FIGS. 1 and 7, each bit of the fifth binary page data may have one of "0" and "1" values, and each bit of the sixth binary page data may have one of "0" and "1" values.

Two bits that are obtained by combining one bit of the fifth binary page data and one bit of the sixth binary page data are expressed by four states of "00", "01", "10", and "11". The shaping encoder 124 may eliminate at least one of the states expressed by the two bits thus combined.

For example, the shaping encoder 124 may eliminate the "10" state from the "00", "01", "10", and "11" states expressed by the two bits thus combined. As an encoded result, the two bits thus combined are expressed by three states "00", "01", and "11". Accordingly, the encoded result may be ternary data. The ternary data may include additional information necessary for decoding and may have a capacity corresponding to two page data having the first size.

Figure 8:
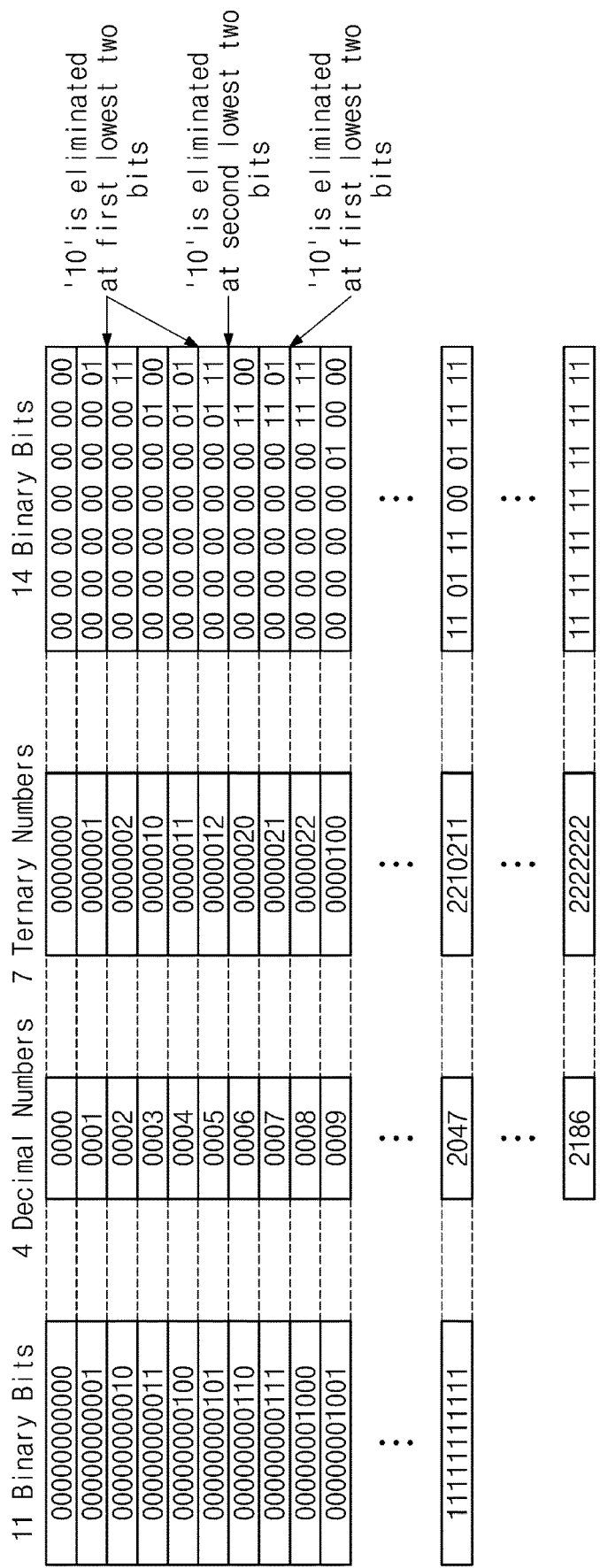
FIG. 8 illustrates an example of a table the shaping encoder and the shaping decoder refers to for state shaping.

FIG. 8 illustrates an example of a table that the shaping encoder 124 and the shaping decoder 129 refers to for state shaping. Referring to FIG. 8, there are illustrated 11 binary bits (e.g., "i" bits), 4 decimal numbers, 7 ternary numbers, and 14 binary bits (e.g., "j" bits). The 4 decimal numbers and the 7 ternary numbers are added for better understanding, and the shaping encoder 124 and the shaping decoder 129 may refer to mapping information of the 11 binary bits and the 14 binary bits.

Values of the 11 binary bits, that is, "00000000000" to "11111111111" may correspond to decimal numbers of "0000" to "2047", respectively. Values of the 7 ternary numbers, that is, "0000000" to "2222222" may correspond to decimal numbers of "0000" to "2186", respectively. Because the number of 7 ternary numbers is more than the number of 11 binary bits, the 11 binary bits may be shaped by mapping the 11 binary bits onto some of values expressed by the 7 ternary numbers.

Data are actually written in the nonvolatile memory device 110 in the form of binary bits. Accordingly, the 7 ternary numbers may be written in the nonvolatile memory device 110 in the form of binary bits. A ternary number is expressed by using three values "0", "1", and "2". Three values may be expressed by two binary bits.

In an embodiment, in the case of eliminating a pattern of "10" from ternary data, a ternary number of "0" may be expressed by "00", a ternary number of "1" may be expressed by "01", and a ternary number of "2" may be expressed by "11". 14 binary bits are obtained as a result of replacing each of the 7 ternary numbers with binary bits of "00", "01", and "11". Some of the 14 binary bits correspond to the 11 binary bits and do not have a pattern of "10".

For example, a ternary number of "0000000" is expressed by binary bits of "00 00 00 00 00 00 00". A ternary number of "0000001" is expressed by binary bits of "00 00 00 00 00 00 01". A ternary number of "0000002" is expressed by binary bits of "00 00 00 00 00 00 11". In this case, a pattern including "10" is eliminated at lowest two bits.

A ternary number of "0000010" is expressed by binary bits of "00 00 00 00 00 0100". A ternary number of "0000011" is expressed by binary bits of "00 00 00 00 00 01 01". A ternary number of "0000012" is expressed by binary bits of "00 00 00 00 00 01 11". In this case, a pattern including "10" is eliminated at lowest two bits.

A ternary number of "0000020" is expressed by binary bits of "00 00 00 00 00 11 00". In this case, a pattern including "10" is eliminated at second lowest two bits. A ternary number of "0000021" is expressed by binary bits of "00 00 00 00 00 11 01". A ternary number of "0000022" is expressed by binary bits of "00 00 00 00 00 11 11". In this case, a pattern including "10" is eliminated at lowest two bits.

A ternary number of "0000100" is expressed by binary bits of "00 00 00 00 01 00 00". A ternary number of "2210211" is expressed by binary bits of "11 01 11 00 01 11 11". A ternary number of "2222222" is expressed by binary bits of "11 11 11 11 11 11 11".

That is, the shaping encoder 124 may shape the fifth and sixth page data expressed by 4 states to ternary data by shaping the 11 binary bits (e.g., a first pattern) to the 14 binary bits (e.g., a second pattern). Likewise, the shaping decoder 129 may shape the ternary data to the fifth and sixth page data by shaping the 14 binary bits to the 11 binary bits.

In an embodiment, the table may map values of the 11 binary bits onto some of values of the 14 binary bits. In this case, when a bit of "1" of the 14 binary bits causes a higher threshold voltage range (refer to FIG. 5), the table may map values, in which the number of 1's is relatively small, from among the 14 binary bits onto values of the 11 binary bits.

When a bit of "0" of the 14 binary bits causes a higher threshold voltage range, the table may map values, in which the number of 0's is relatively small, from among the 14 binary bits onto values of the 11 binary bits.

In an embodiment, when "z" binary bits are shaped to "x" n-ary numbers, a value of "x" may be determined by Equation 1 below.

$$x = y \cdot \lceil \log_2 n \rceil$$ [Equation 1]

Here, "y" is a number determining a range of values of the "x" n-ary numbers, and the number thus determined has to satisfy a condition of Equation 2 below.

$$2^z < n^y$$ [Equation 2]

Referring to the example of FIG. 8, "z" is 11, "n" is 3, and "y" is 7. Accordingly, the condition of Equation 2 is satisfied. According to Equation 1, because "n" is 3, a ceiling value of a log value is 2. Accordingly, "x" is 14.

As "x" is determined, the second size of the fifth and sixth page data (refer to FIGS. 5 and 6) may be determined. The second size may be determined by Equation 3 below.

$$S2 = \frac{z}{x} \cdot S1$$ [Equation 3]

In Equation 3, S1 indicates the first size, and S2 indicates the second size.

Figure 9:
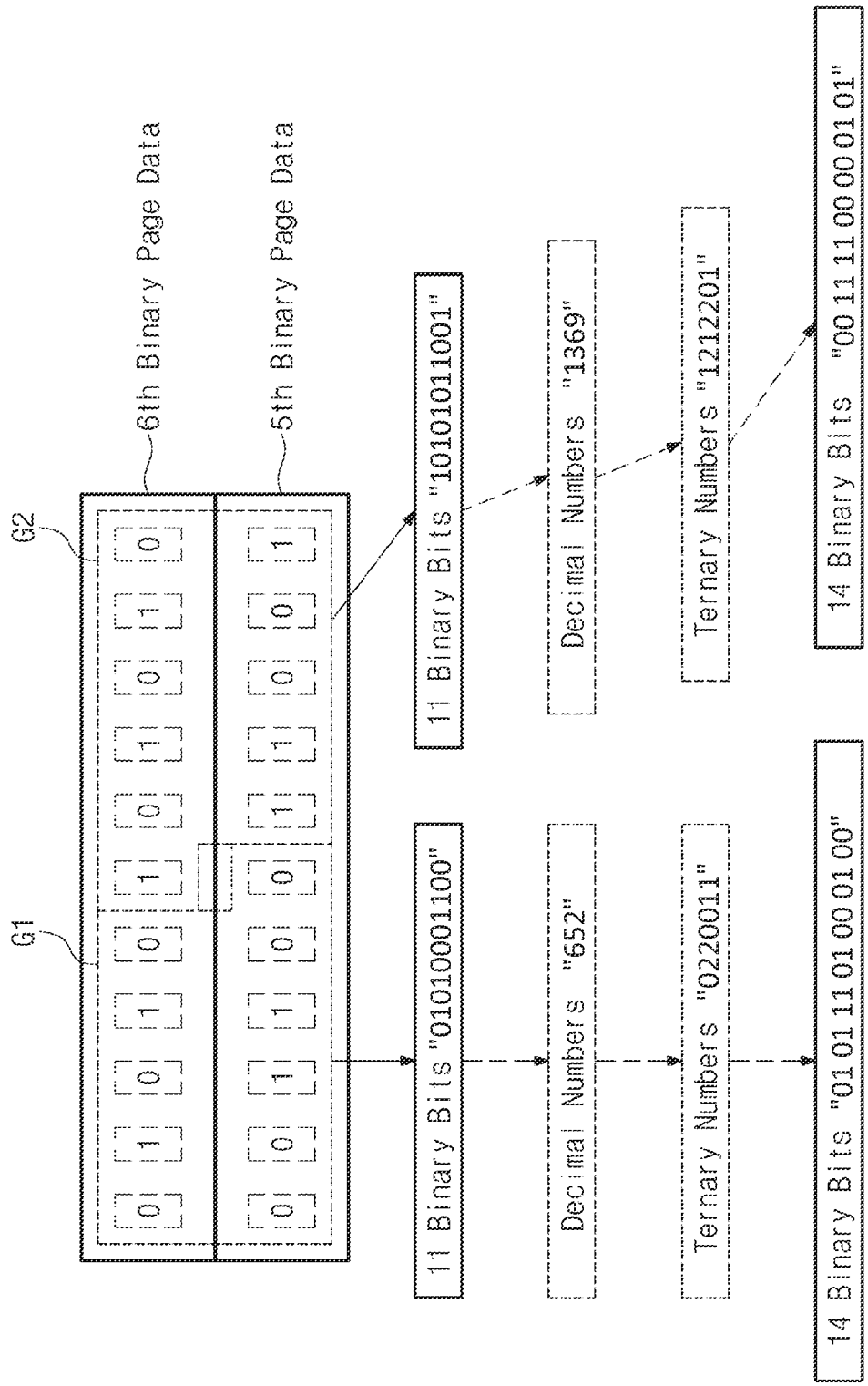
FIGS. 9 and 10 as taken together illustrate an example descriptive of how the shaping encoder shapes 11 binary bits to 14 binary bits to generate ternary data.
Figure 10:
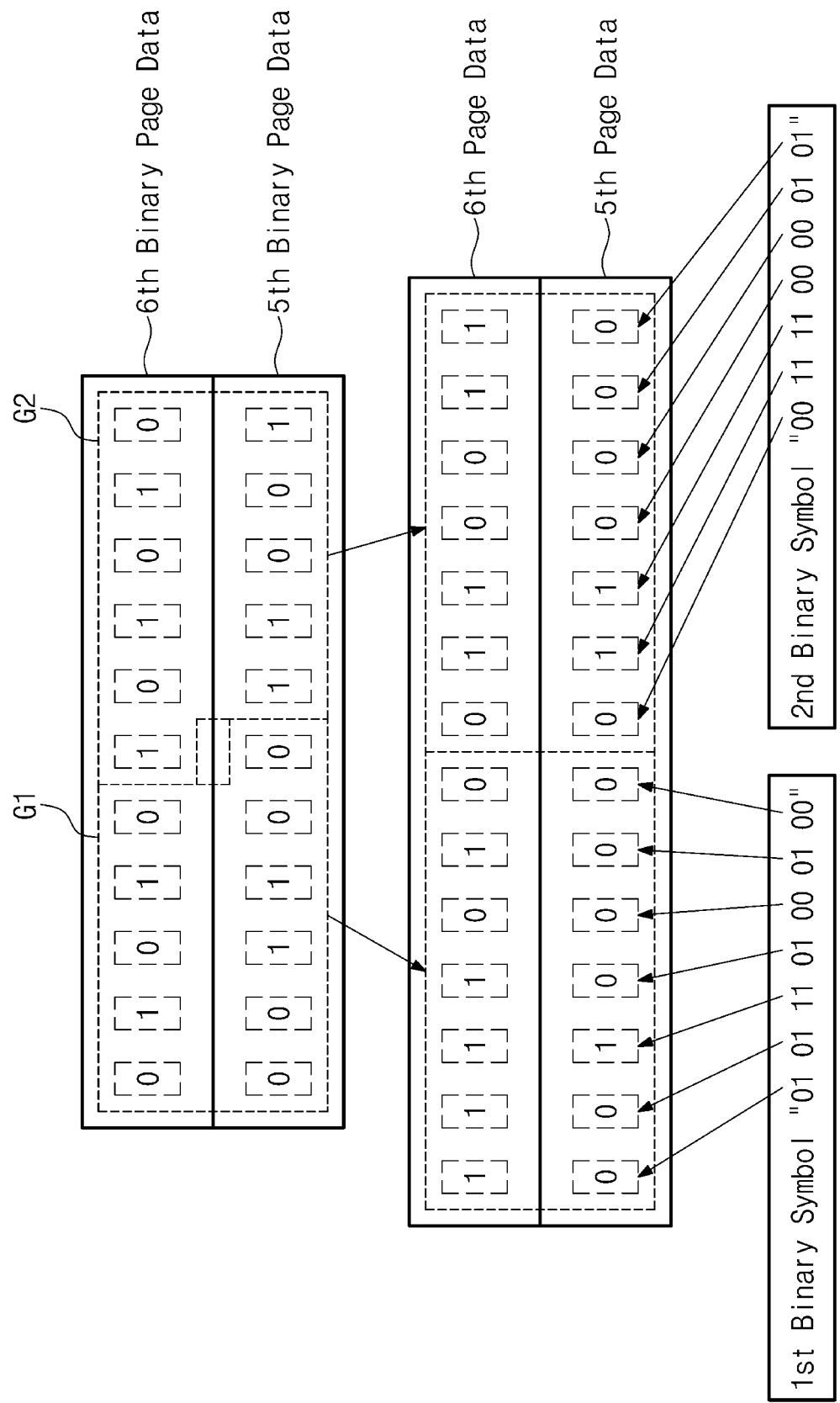

FIGS. 9 and 10 as taken together illustrate an example descriptive of how the shaping encoder 124 shapes 11 binary bits to 14 binary bits to generate ternary data. Referring to FIGS. 1 and 9, the fifth binary page data may include bits of "00110011001", and the sixth binary page data may include binary data of "01010101010".

The shaping encoder 124 may select 11 bits from the fifth and sixth binary page data. Ways to select 11 bits is illustrated in FIG. 9 as an example, but the inventive concepts are not limited to the way to select 11 bits shown in FIG. 9. The shaping encoder 124 may select 11 bits from the fifth binary page data, the sixth binary page data, or the fifth and sixth binary page data.

In an embodiment, the shaping encoder 124 may select "01010001100" of a first group G1 as 11 binary bits. The 11 binary bits may correspond to a value of decimal numbers "652" or a value of ternary numbers of "0220011". A value of decimal numbers and a value of ternary numbers are provided for better understanding, and the shaping encoder 124 may not refer to a value of decimal numbers and a value of ternary numbers. According to the table illustrated in FIG. 8, the 11 binary bits may be shaped to 14 binary bits of "01 01 11 01 00 01 00".

Also, the shaping encoder 124 may select "10101011001" of a second group G2 as 11 binary bits. The 11 binary bits may correspond to a value of decimal numbers of "1369" or a value of ternary numbers of "1212201". According to the table illustrated in FIG. 8, the 11 binary bits may be shaped to 14 binary bits of "00 11 11 00 00 01 01".

Referring to FIGS. 1 and 10, the shaping encoder 124 may place 14 binary bits at positions of the fifth and sixth binary page data to generate fifth and sixth page data. For example, one of two binary bits expressing one ternary number may be placed at the fifth page data, and the other thereof may be placed at the sixth page data.

Bits of the fifth and sixth page data, which correspond to the same position (horizontally), are written at the same memory cell. According to the state shaping, in the fifth and sixth page data, bits of "10" (in an order of a fifth page data bit and a sixth page data bit) are prevented from being written in the same memory cell. The fifth and sixth page data may be ternary data expressed by states of "00", "01" and "11".

The fifth and sixth page data are provided to the n-ary ECC encoder 125 as the fifth write data WD5. The n-ary ECC encoder 125 may generate a parity from the fifth and sixth page data and may prevent the pattern of "10" from being included in the parity.

For example, the n-ary ECC encoder 125 may receive a segment including a unit(s) of 14 bits consisting of "00", "01", and "11" and may add a parity including bits consisting of "00", "01", and "11" to the segment. Accordingly, the sixth write data WD6 may also be ternary data.

The fifth and sixth page data may be written at one physical page of the nonvolatile memory device 110 together with the first to fourth binary page data, as the seventh write data WD7. The first to fourth binary page data may be expressed by 16 (2×2×2×2) states that the memory cells MC have. Because the fifth and sixth page data are expressed by 3 states, the first to fourth binary page data and the fifth and sixth page data may be expressed by 48 (2×2×2×2×3) states that the memory cells MC have.

Figure 11:
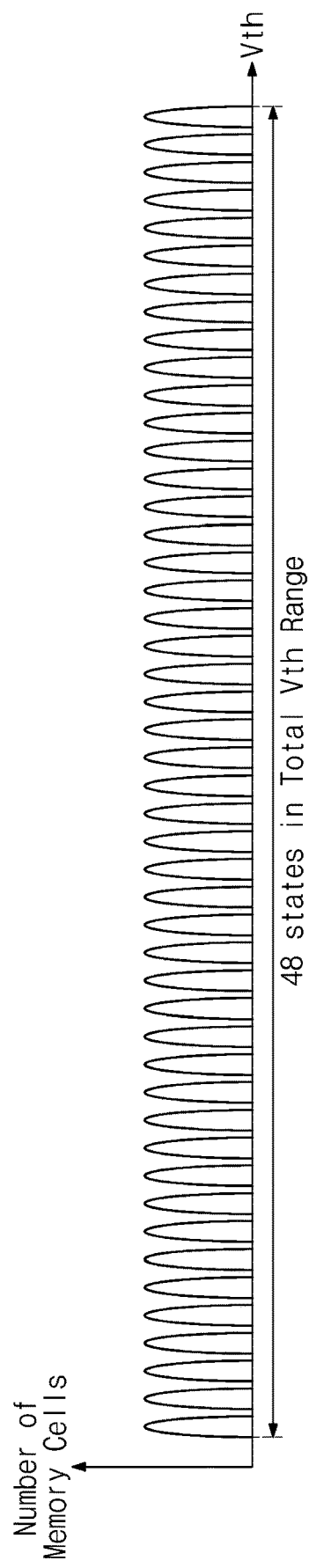
FIG. 11 illustrates an example of 48 states that memory cells may have.

FIG. 11 illustrates an example of 48 states that the memory cells MC may have. In FIG. 11, a horizontal axis represents threshold voltages of the memory cells MC, and a vertical axis represents the number of memory cells MC. Referring to FIGS. 4 and 11, the memory cells MC may belong to different threshold voltage ranges and may be distinguished as having different states.

The first to fourth binary page data, and the fifth and sixth page data, may be expressed by 48 states (e.g., k states) in the total threshold voltage range. Compared to the 64 states (i.e., $2^{\wedge}m$ or $2^m$ states) of FIG. 5, a width of an individual threshold voltage range (or state) may increase, and a distance between threshold voltage ranges (or states), that is, a read margin also increases. Accordingly, compared to the case of FIG. 5, data written in the memory cells MC become more robust against error.

Voltages (e.g., a program voltage, a pass voltage, etc.) for writing the 64 states of FIG. 5 may be different from voltages for writing the 48 states of FIG. 11. Also, voltages (e.g., a read voltage, a read pass voltage, etc.) for reading the 64 states of FIG. 5 may be different from voltages for reading the 48 states of FIG. 11.

Figure 12:
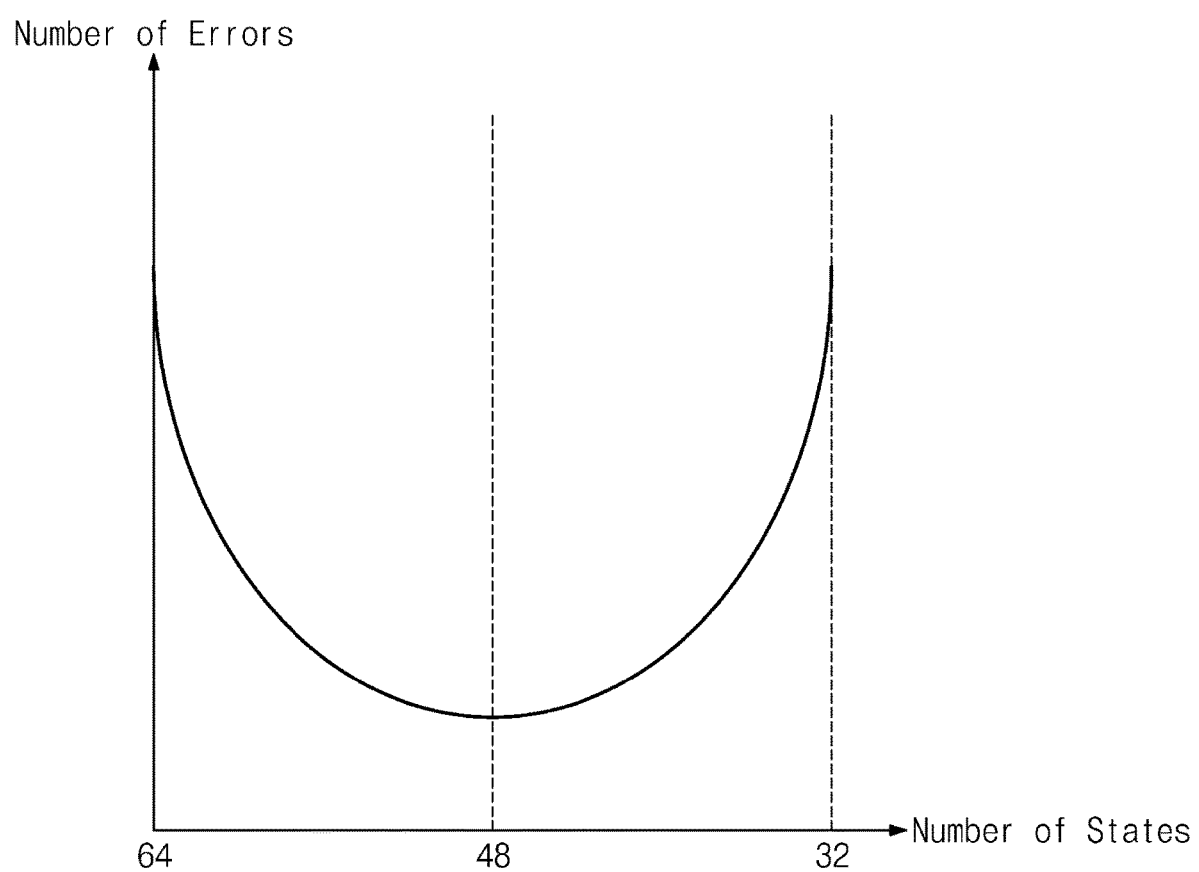
FIG. 12 illustrates the number of errors according to the number of states written in memory cells.

FIG. 12 illustrates the number of errors according to the number of states written in the memory cells MC. In FIG. 12, a horizontal axis represents the number of states, and a vertical axis represents the number of errors. Referring to FIGS. 1, 4, and 11, the number of errors is measured while changing the number of states to be written in the memory cells MC in a range from 64 to 32.

As the number of states decreases from 64 to 48, the number of errors gradually decreases. As the number of states decreases from 48 to 32, the number of errors gradually increases. The reason is that the effect of error correction code (ECC) varies depending on the number of states.

FIGS. 13 to 18 illustrate controllers that are implemented according to various embodiments of the inventive concepts. In FIGS. 13 to 18, binary page data means that each page consists of bits expressed by two states. For example, in two binary page data, 4 states may be expressed by combining a bit of one binary page data and a bit of the other binary page data.

For example, n-ary page data (n being an integer more than 2) means that bits of pieces of page data, which are at the same position, are expressed by "n" states. For example, two ternary page data are expressed by 3 states that are obtained by combining a bit of one ternary page data and a bit of the other ternary page data.

Figure 13:
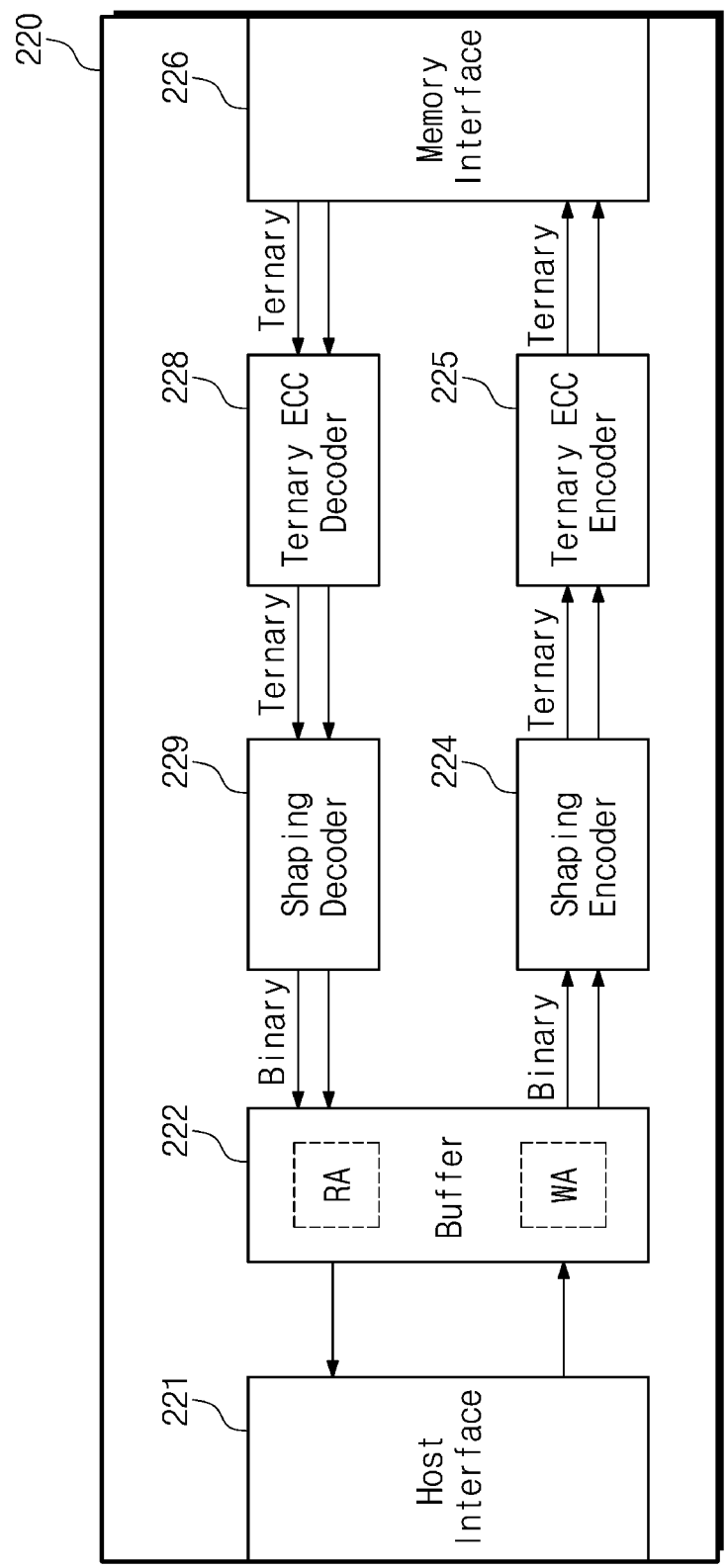
FIG. 13 illustrates a controller according to an example embodiment of the inventive concepts.

FIG. 13 illustrates a controller 220 implemented according to an example embodiment of the inventive concepts. Referring to FIGS. 1 and 13, the controller 220 may include a host interface 221, a buffer 222, a shaping encoder 224, a ternary ECC encoder 225, a memory interface 226, a ternary ECC decoder 228, and a shaping decoder 229.

The shaping encoder 224 may receive two binary page data expressed by 4 states from the write area WA of the buffer 222. As described with reference to FIG. 10, the shaping encoder 224 may shape two binary page data to two page data (e.g., pieces of ternary page data) expressed by 3 states.

The ternary ECC encoder 225 may add a parity expressed by 3 states to the two ternary page data. The ternary page data that the parity is added may be written in the nonvolatile memory device 110 (e.g., see FIG. 1) through the memory interface 226.

Likewise, the ternary ECC decoder 228 may receive two ternary page data expressed by 3 states through the memory interface 226 from the nonvolatile memory device 110. The ternary ECC decoder 228 may correct errors of the two ternary page data by using the parity and may eliminate the parity.

The shaping decoder 229 may shape the 2 error-corrected ternary page data to two binary page data. The shaping decoder 229 may store the two binary page data in the read area RA of the buffer 222.

That is, the controller 220 may shape multi-level cell (MLC) page data expressed by 4 states to ternary page data expressed by 3 states and may write the ternary page data in the nonvolatile memory device 110.

Figure 14:
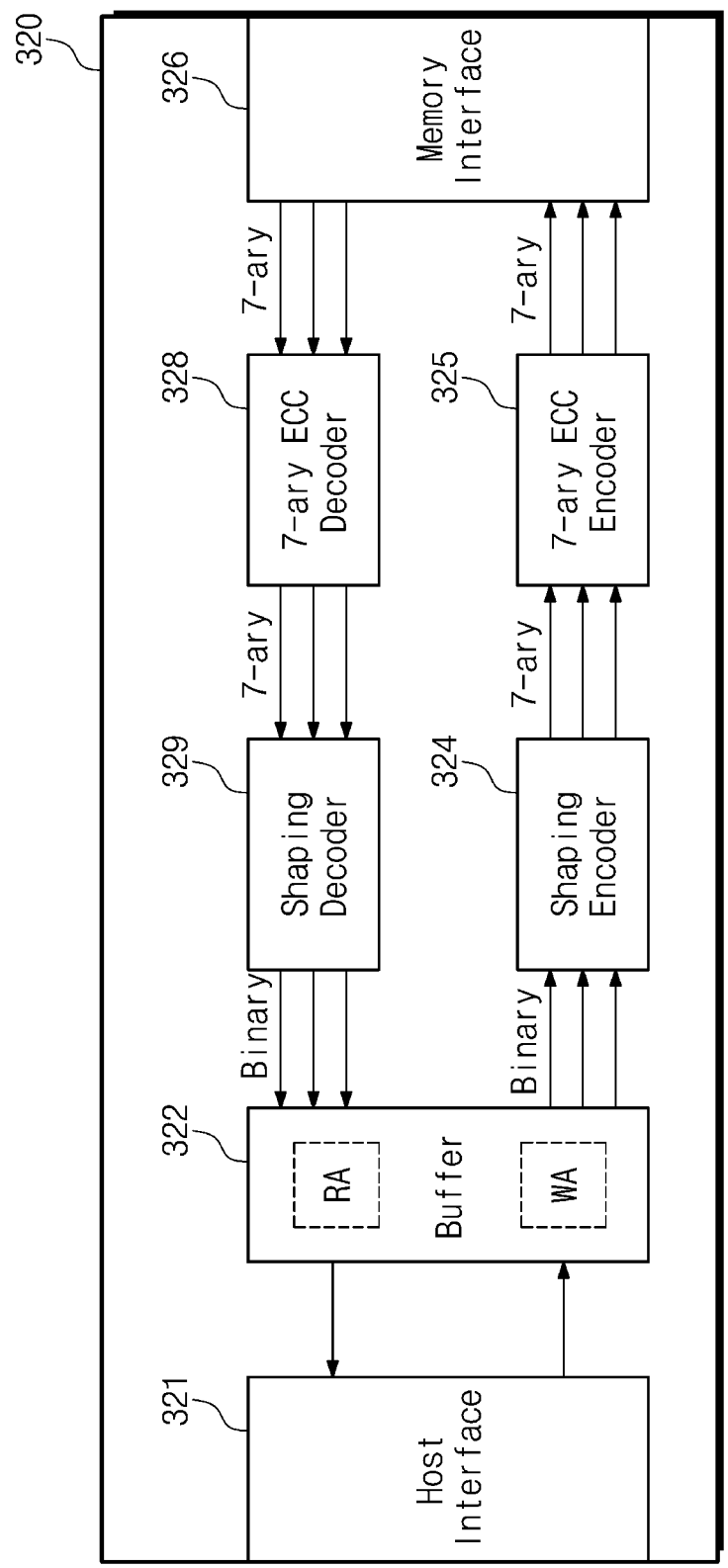
FIG. 14 illustrates a controller according to another example embodiment of the inventive concepts.

FIG. 14 illustrates a controller 320 implemented according to another example of the inventive concepts. Referring to FIGS. 1 and 14, the controller 320 may include a host interface 321, a buffer 322, a shaping encoder 324, a 7-ary ECC encoder 325, a memory interface 326, a 7-ary ECC decoder 328, and a shaping decoder 329.

The shaping encoder 324 may receive three binary page data expressed by 8 states from the write area WA of the buffer 322. As described with reference to FIG. 10, the shaping encoder 324 may shape three binary page data to three page data (e.g., pieces of 7-ary page data) expressed by 7 states.

The 7-ary ECC encoder 325 may add a parity expressed by 7 states to the three 7-ary page data. The three 7-ary page data that the parity is added may be written in the nonvolatile memory device 110 (e.g., see FIG. 1) through the memory interface 326.

Likewise, the 7-ary ECC decoder 328 may receive three 7-ary page data expressed by 7 states through the memory interface 326 from the nonvolatile memory device 110. The 7-ary ECC decoder 328 may correct errors of the three 7-ary page data by using the parity and may eliminate the parity.

The shaping decoder 329 may shape the 3 error-corrected 7-ary page data to three binary page data. The shaping decoder 329 may store the three binary page data in the read area RA of the buffer 322.

That is, the controller 320 may shape triple level cell (TLC) page data expressed by 8 states to 7-ary page data expressed by 7 states and may write the 7-ary page data in the nonvolatile memory device 110.

Figure 15:
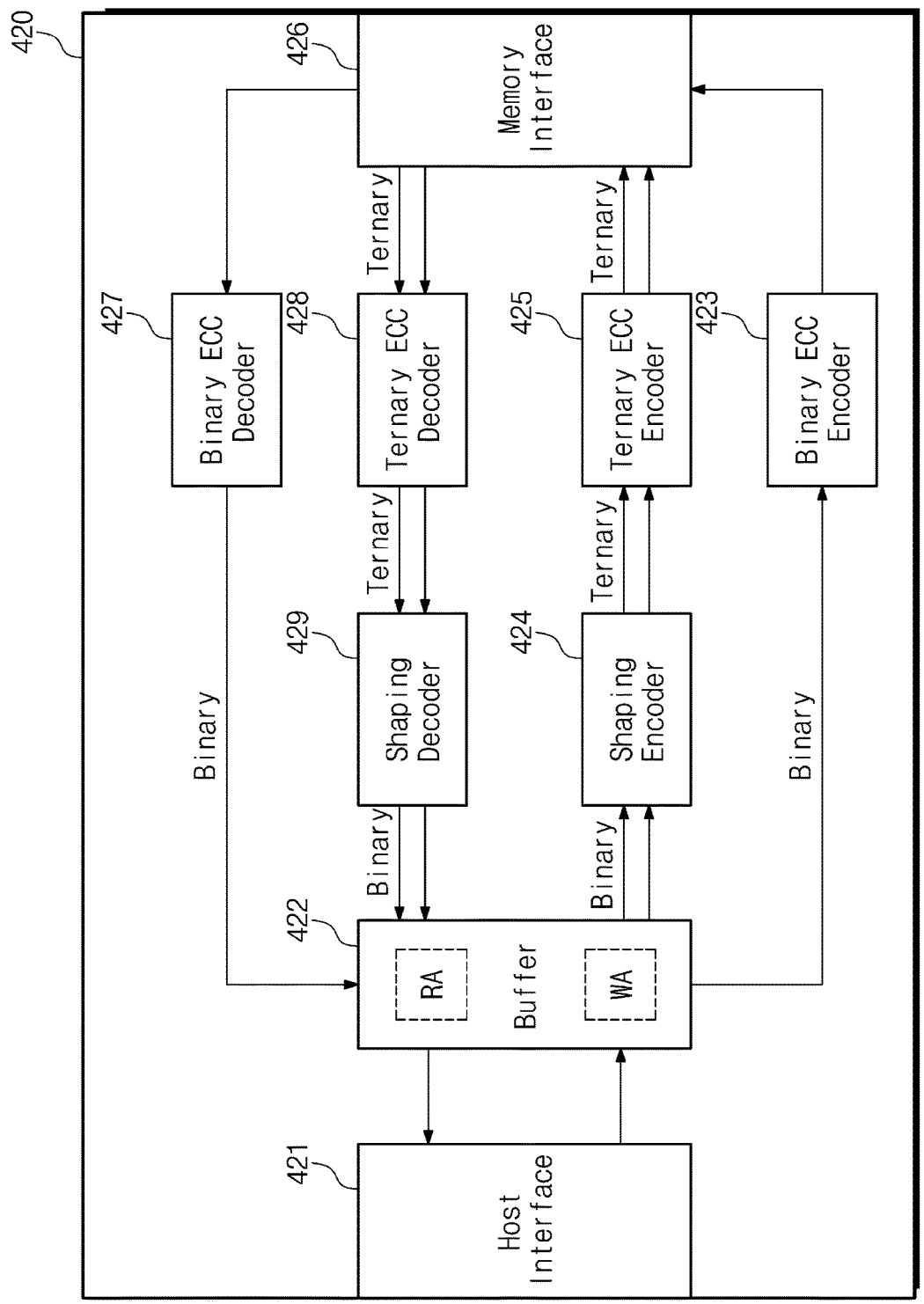
FIG. 15 illustrates a controller according to another example embodiment of the inventive concepts.

FIG. 15 illustrates a controller 420 implemented according to another example of the inventive concepts. Referring to FIGS. 1 and 15, the controller 420 may include a host interface 421, a buffer 422, a binary ECC encoder 423, a shaping encoder 424, a ternary ECC encoder 425, a memory interface 426, a binary ECC decoder 427, a ternary ECC decoder 428, and a shaping decoder 429.

The binary ECC encoder 423 may receive one binary page data expressed by 2 states from the write area WA of the buffer 422. The binary ECC encoder 423 may add a parity to the binary page data and may provide the binary-ECC-encoded binary page data to the memory interface 426.

The shaping encoder 424 may receive two binary page data expressed by 4 states from the write area WA of the buffer 422. As described with reference to FIG. 10, the shaping encoder 424 may shape two binary page data to two page data (e.g., pieces of ternary page data) expressed by 3 states.

The ternary ECC encoder 425 may add a parity expressed by 3 states to the two ternary page data. The two ternary-ECC-encoded ternary page data may be provided to the memory interface 426. The memory interface 426 may transmit the one binary-ECC-encoded binary page data and the two ternary-ECC-encoded ternary page data expressed by 6 states to the nonvolatile memory device 110 (e.g., see FIG. 1) so as to be written therein.

Likewise, the binary ECC decoder 427 may receive one binary page data expressed by 2 states through the memory interface 426 from the nonvolatile memory device 110. The binary ECC decoder 427 may correct errors of the binary page data by using the parity and may eliminate the parity. The one ECC-decoded binary page data may be stored in the read area RA of the buffer 422.

The ternary ECC decoder 428 may receive two ternary page data expressed by 3 states through the memory interface 426 from the nonvolatile memory device 110. The ternary ECC decoder 428 may correct errors of the two ternary page data by using the parity and may eliminate the parity.

The shaping decoder 429 may shape the two ECC-decoded ternary page data to two binary page data. The shaping decoder 429 may store the two binary page data in the read area RA of the buffer 422.

That is, the controller 420 may shape TLC page data expressed by 8 states to one binary page data and two ternary page data expressed by 6 states and may write the shaped data in the nonvolatile memory device 110.

Figure 16:
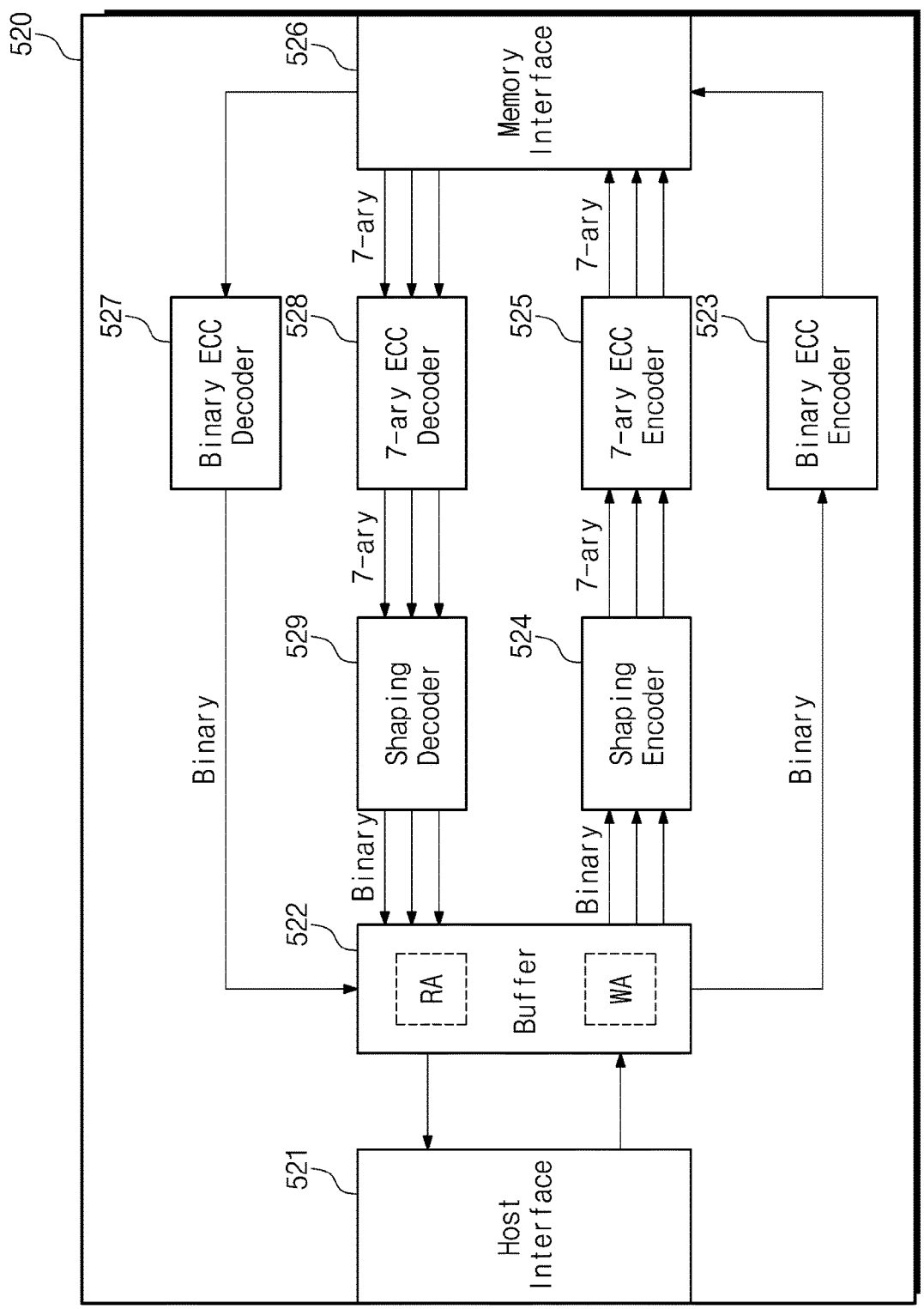
FIG. 16 illustrates a controller according to another example embodiment of the inventive concepts.

FIG. 16 illustrates a controller 520 implemented according to another example of the inventive concepts. Referring to FIGS. 1 and 16, the controller 520 may include a host interface 521, a buffer 522, a binary ECC encoder 523, a shaping encoder 524, a 7-ary ECC encoder 525, a memory interface 526, a binary ECC decoder 527, a 7-ary ECC decoder 528, and a shaping decoder 529.

The binary ECC encoder 523 may receive one binary page data expressed by 2 states from the write area WA of the buffer 522. The binary ECC encoder 523 may add a parity to the binary page data and may provide the binary-ECC-encoded binary page data to the memory interface 526.

The shaping encoder 524 may receive three binary page data expressed by 8 states from the write area WA of the buffer 522. As described with reference to FIG. 10, the shaping encoder 524 may shape three binary page data to three page data (e.g., pieces of 7-ary page data) expressed by 7 states.

The 7-ary ECC encoder 525 may add a parity expressed by 7 states to the three 7-ary page data. The three 7-ary-ECC-encoded 7-ary page data may be provided to the memory interface 526. The memory interface 526 may transmit the one binary-ECC-encoded binary page data and the three 7-ary-ECC-encoded 7-ary page data expressed by 14 states to the nonvolatile memory device 110 (e.g., see FIG. 1) so as to be written therein.

Likewise, the binary ECC decoder 527 may receive one binary page data expressed by 2 states through the memory interface 526 from the nonvolatile memory device 110. The binary ECC decoder 527 may correct errors of the binary page data by using the parity and may eliminate the parity. The one ECC-decoded binary page data may be stored in the read area RA of the buffer 522.

The 7-ary ECC decoder 528 may receive three 7-ary page data expressed by 7 states through the memory interface 526 from the nonvolatile memory device 110. The 7-ary ECC decoder 528 may correct errors of the three 7-ary page data by using the parity and may eliminate the parity.

The shaping decoder 529 may shape the three ECC-decoded 7-ary page data to three binary page data. The shaping decoder 529 may store the three binary page data in the read area RA of the buffer 522.

That is, the controller 520 may shape quad level cell (QLC) page data expressed by 16 states to one binary page data and two 7-ary page data expressed by 14 states and may write the shaped data in the nonvolatile memory device 110.

Figure 17:
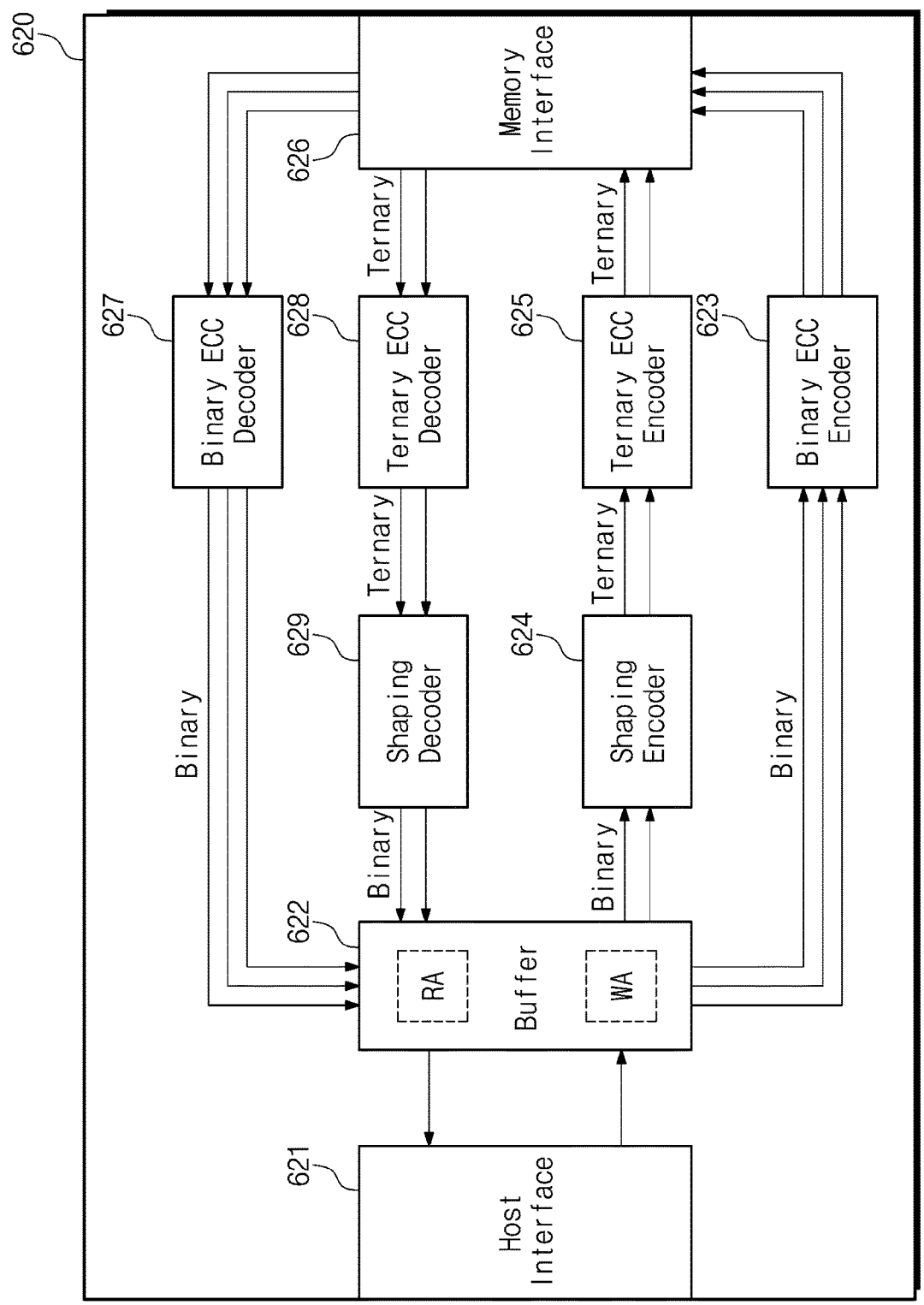
FIG. 17 illustrates a controller according to another example embodiment of the inventive concepts.

FIG. 17 illustrates a controller 620 implemented according to another example of the inventive concepts. Referring to FIGS. 1 and 17, the controller 620 may include a host interface 621, a buffer 622, a binary ECC encoder 623, a shaping encoder 624, a ternary ECC encoder 625, a memory interface 626, a binary ECC decoder 627, a ternary ECC decoder 628, and a shaping decoder 629.

The binary ECC encoder 623 may receive three binary page data expressed by 8 states from the write area WA of the buffer 622. The binary ECC encoder 623 may add a parity to the three binary page data and may transmit the three binary-ECC-encoded binary page data to the memory interface 626.

The shaping encoder 624 may receive two binary page data expressed by 4 states from the write area WA of the buffer 622. As described with reference to FIG. 10, the shaping encoder 624 may shape two binary page data to two page data (e.g., pieces of ternary page data) expressed by 3 states.

The ternary ECC encoder 625 may add a parity expressed by 3 states to the two ternary page data. The two ternary-ECC-encoded ternary page data may be provided to the memory interface 626. The memory interface 626 may transmit the three binary-ECC-encoded binary page data and the two ternary-ECC-encoded ternary page data expressed by 24 states to the nonvolatile memory device 110 (e.g., see FIG. 1) so as to be written therein.

Likewise, the binary ECC decoder 627 may receive three binary page data expressed by 8 states through the memory interface 626 from the nonvolatile memory device 110. The binary ECC decoder 627 may correct errors of the three binary page data by using the parity and may eliminate the parity. The three ECC-decoded binary page data may be stored in the read area RA of the buffer 622.

The ternary ECC decoder 628 may receive two ternary page data expressed by 3 states through the memory interface 626 from the nonvolatile memory device 110. The ternary ECC decoder 628 may correct errors of the two ternary page data by using the parity and may eliminate the parity.

The shaping decoder 629 may shape the two ECC-decoded ternary page data to two binary page data. The shaping decoder 629 may store the two binary page data in the read area RA of the buffer 622.

That is, the controller 620 may shape penta level cell (PLC) page data expressed by 32 states to three binary page data and two ternary page data expressed by 24 states and may write the shaped data in the nonvolatile memory device 110.

Figure 18:
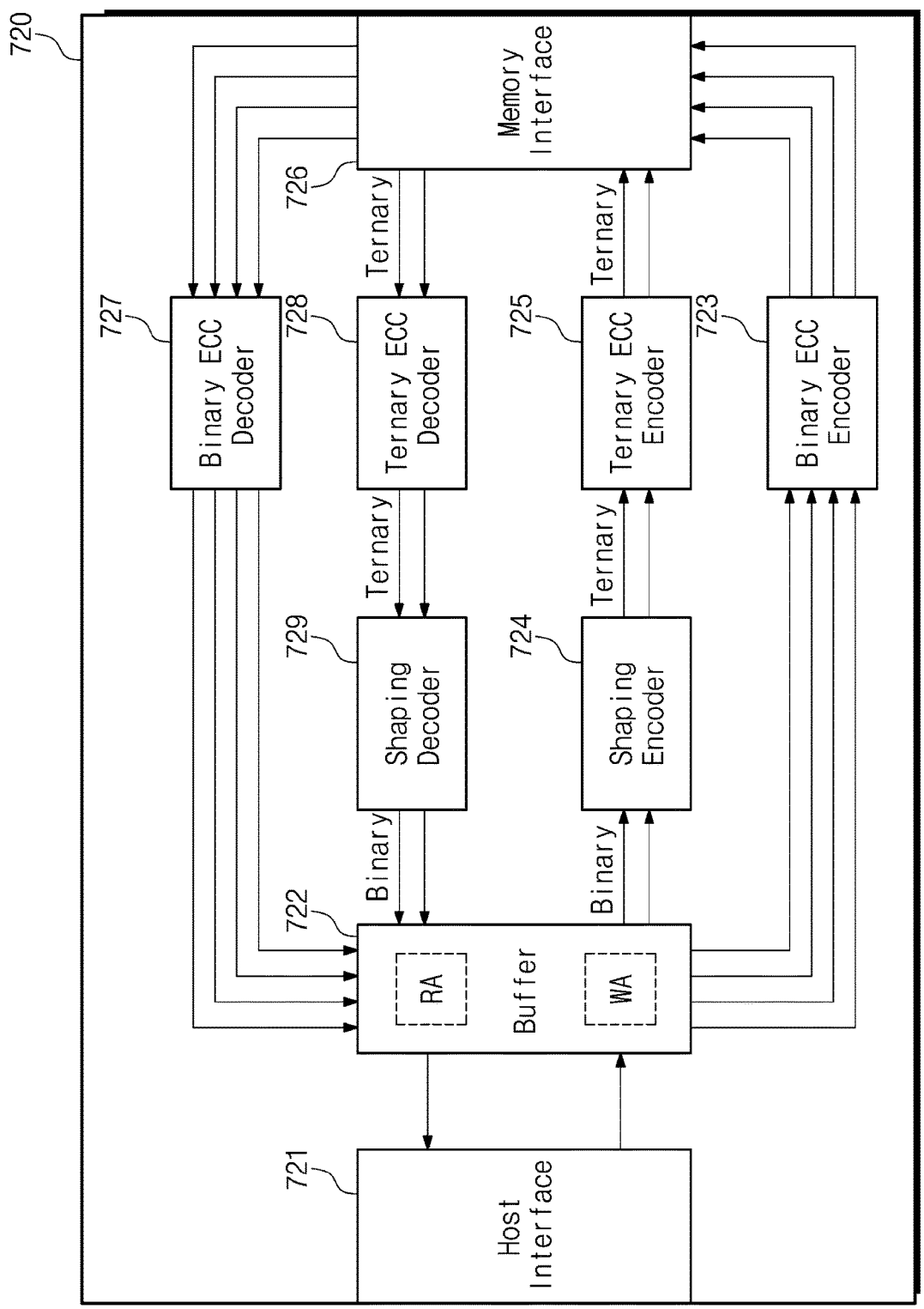
FIG. 18 illustrates a controller according to another example embodiment of the inventive concepts.

FIG. 18 illustrates a controller 720 implemented according to another example of the inventive concepts. Referring to FIGS. 1 and 18, the controller 720 may include a host interface 721, a buffer 722, a binary ECC encoder 723, a shaping encoder 724, a ternary ECC encoder 725, a memory interface 726, a binary ECC decoder 727, a ternary ECC decoder 728, and a shaping decoder 729.

The binary ECC encoder 723 may receive four binary page data expressed by 16 states from the write area WA of the buffer 722. The binary ECC encoder 723 may add a parity to the four binary page data and may transmit the four binary-ECC-encoded binary page data to the memory interface 726.

The shaping encoder 724 may receive two binary page data expressed by 4 states from the write area WA of the buffer 722. As described with reference to FIG. 10, the shaping encoder 724 may shape two binary page data to two page data (e.g., pieces of ternary page data) expressed by 3 states.

The ternary ECC encoder 725 may add a parity expressed by 3 states to the two ternary page data. The two ternary-ECC-encoded ternary page data may be provided to the memory interface 726. The memory interface 726 may transmit the four binary-ECC-encoded binary page data and the two ternary-ECC-encoded ternary page data expressed by 48 states to the nonvolatile memory device 110 (see FIG. 1) so as to be written therein.

Likewise, the binary ECC decoder 727 may receive four binary page data expressed by 16 states through the memory interface 726 from the nonvolatile memory device 110. The binary ECC decoder 727 may correct errors of the four binary page data by using the parity and may eliminate the parity. The four ECC-decoded binary page data may be stored in the read area RA of the buffer 722.

The ternary ECC decoder 728 may receive two ternary page data expressed by 3 states through the memory interface 726 from the nonvolatile memory device 110. The ternary ECC decoder 728 may correct errors of the two ternary page data by using the parity and may eliminate the parity.

The shaping decoder 729 may shape the two ECC-decoded ternary page data to two binary page data. The shaping decoder 729 may store the two binary page data in the read area RA of the buffer 722.

That is, the controller 720 may shape hexa level cell (HLC) page data expressed by 64 states to four binary page data and two ternary page data expressed by 48 states and may write the shaped data in the nonvolatile memory device 110.

In an embodiment, when two or more binary page data are received, a binary ECC encoder or a binary ECC decoder may perform ECC encoding or ECC decoding on the two or more binary page data sequentially or simultaneously (or in parallel).

In an embodiment, a controller may include two or more shaping encoders, two or more n-ary ECC encoders, two or more n-ary ECC decoders, and two or more shaping decoders. The two or more shaping encoders may shape pieces of input binary page data to pieces of the same or different n-ary page data.

The two or more shaping decoders may shape pieces of the same or different n-ary page data received to binary page data. As the two or more shaping encoders are used, the number of states that memory cells of the nonvolatile memory device 110, in which data are written, have may be variously changed or applied.

In an embodiment, description is given as page data corresponding to one physical page PP are read from the write area WA, are selectively encoded, and are written in the nonvolatile memory device 110. However, pieces of page data may be continuously encoded and not written in the nonvolatile memory device 110.

For example, the nonvolatile memory device 110 may be configured to write data in two or more pages alternately. At a timing to write pieces of binary page data at one of two or more pages, one or more binary page data may be read from the write area WA, may be binary ECC encoded, and may be written at the one page.

Afterwards, at a timing to write pieces of binary page data at another of the two or more pages, one or more binary page data may be read from the write area WA, may be binary ECC encoded, and may be written at the another page.

At a timing to write pieces of n-ary page data at one of two or more pages, two or more binary page data may be read from the write area WA, may be shape encoded, may be n-ary ECC encoded, and may be written at one page.

FIG. 19 illustrates an example of operators defined in a Galois field of a ternary number. Referring to FIGS. 1 and 19, the n-ary ECC encoder 125 and the n-ary ECC decoder 128 may be based on a Galois field of an n-ary number. In an embodiment, an example where operators of a Galois field of a ternary number are defined is illustrated in FIG. 19.

A first operator OP1 may define addition. For example, the addition may be defined as a remainder that is obtained by dividing a result of adding two values by 3. A second operator OP2 may define multiplication. In the multiplication, when one of two values is "0", a result of the multiplication is "0". When the two values are "1" and "2", a result of the multiplication is "2". When each of the two values is "1" or "2", a result of the multiplication is "1".

A constraint for error correction encoding and decoding may be defined based on the first operator OP1 and the second operator OP2. For example, when a constraint of Equation 4 below is satisfied, a constraint that is regarded as an error is absent may be defined.

$$2x_1+x_3+x_4=0$$

$$x_2+x_3+2x_4=0$$

$$2x_1+2x_2+x_3=0 \qquad \text{[Equation 4]}$$

A generator matrix and a check matrix may be obtained from the constraint of Equation 4. The n-ary ECC encoder 125 may generate a parity by using the generator matrix, and the n-ary ECC decoder 128 may check an error by using the check matrix.

Figure 20:
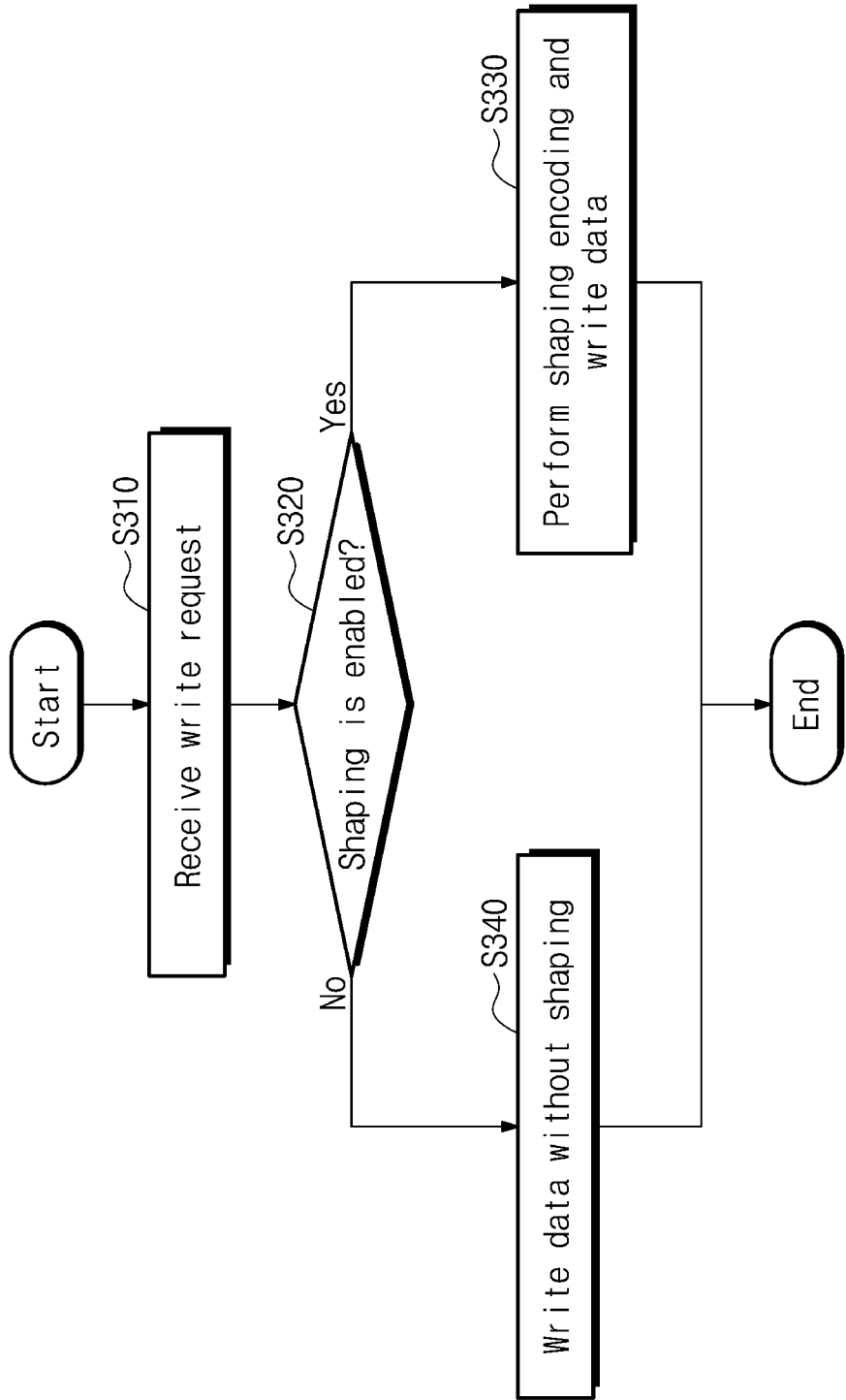
FIG. 20 illustrates a flow chart descriptive of an example embodiment of how a storage device performs a write operation when state shaping is selectively enabled.

FIG. 20 illustrates a flow chart descriptive of an example embodiment of how the storage device 100 performs a write operation when state shaping is selectively enabled. Referring to FIGS. 1 and 20, in operation S310 the controller 120 receives a write request.

In operation S320, the controller 120 determines whether shaping is enabled. For example, the enablement and disablement of the state shaping may be set by an external host device or depending on an internal policy of the controller 120.

When it is determined that the shaping is enabled (Yes in S320), in operation S330 the controller 120 performs the state shaping and transmits shaped data to the nonvolatile memory device 110. Also, the controller 120 allows the nonvolatile memory device 110 to write data in a first operating mode by using first write voltages. For example, data written in the nonvolatile memory device 110 may have the 48 states as described with reference to FIG. 11.

When it is determined that the shaping is not enabled (No is S320), in operation S340 the controller 120 transmits the data to the nonvolatile memory device 110 without shaping. Also, the controller 120 allows the nonvolatile memory device 110 to write data in a second operating mode by using second write voltages. For example, data written in the nonvolatile memory device 110 may have the 64 states as described with reference to FIG. 5.

The controller 120 may write a flag indicating whether data are shaped, together with the data. As another example, the controller 120 may record the flag indicating whether data are shaped, at metadata storing mapping information between a logical address of the external host device and a physical address of the nonvolatile memory device 110.

Figure 21:
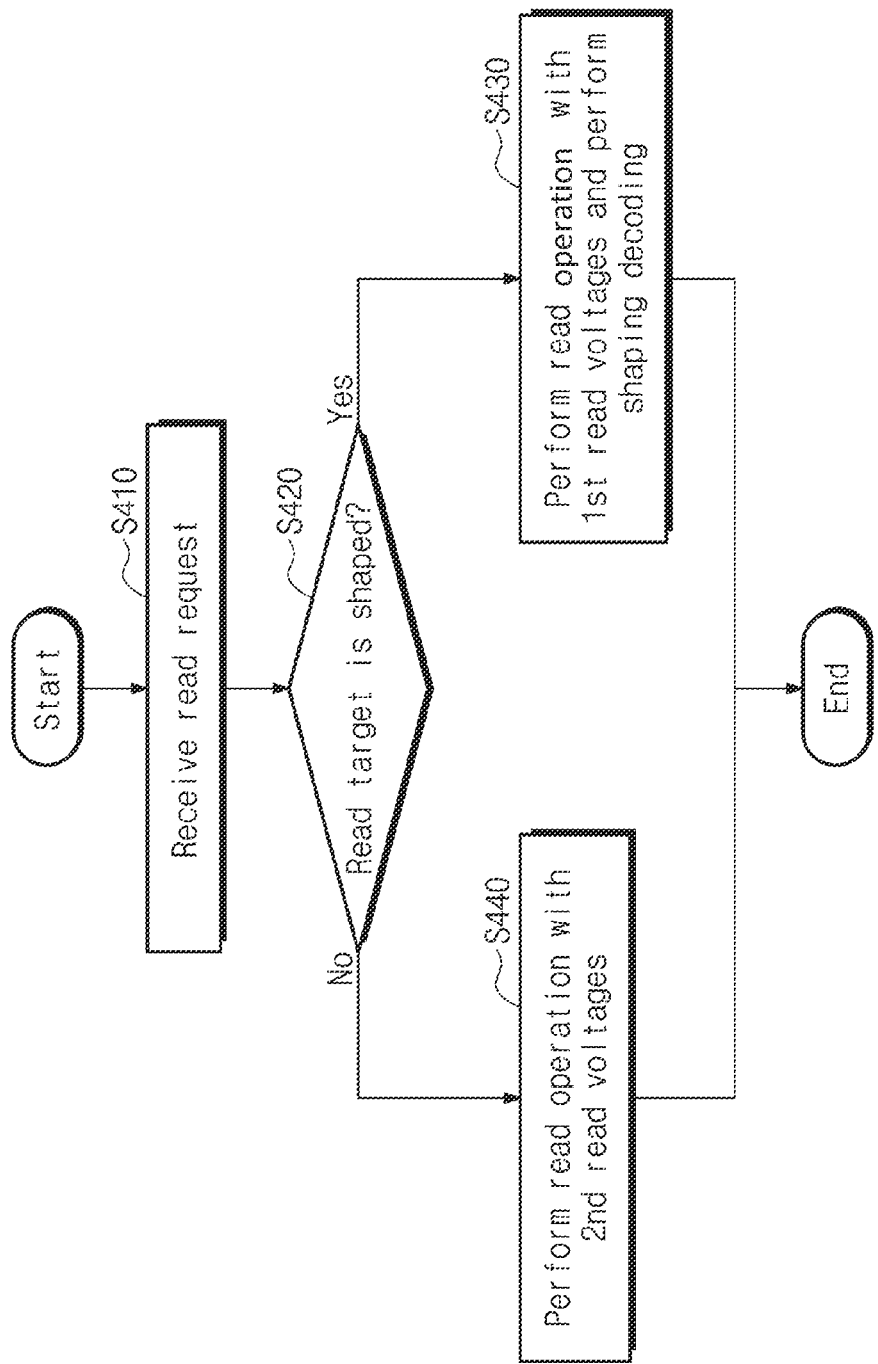
FIG. 21 illustrates a flow chart descriptive of an example embodiment of how a storage device performs a read operation when state shaping is selectively enabled.

FIG. 21 illustrates a flow chart descriptive of an example embodiment of how the storage device 100 performs a read operation when state shaping is selectively enabled. Referring to FIGS. 1 and 21, in operation S410 the controller 120 receives a read request.

In operation S420, the controller 120 determines whether read-requested data are shaped. For example, the controller 120 may determine whether read-requested data are shaped, by reading the flag from the nonvolatile memory device 110 or by referring to a record of metadata.

When it is determined that the read-requested data are shaped (Yes in S420), in operation S430 the controller 120 allows the nonvolatile memory device 110 to read data in the first operating mode by using first read voltages.

When it is determined that the read-requested data are not shaped (No in S420), in operation S440 the controller 120 allows the nonvolatile memory device 110 to read data in the second operating mode by using second read voltages.

In the above-described embodiments, components of the storage device 100 are described by using the terms "first", "second", "third", and the like. However, the terms "first", "second", "third", and the like may be used merely to distinguish components from each other and not to limit the inventive concepts. For example, the terms "first", "second", "third", and the like do not involve an order or a numerical meaning of any form.

In the above embodiments, components according to embodiments of the inventive concepts are shown as blocks. The blocks may be implemented with various hardware devices, such as integrated circuits, application specific ICs (ASCI), field programmable gate arrays (FPGA), and complex programmable logic devices (CPLD), firmware driven in hardware devices, software such as an application, or a combination of hardware devices and software. Also, the blocks may include circuits enrolled as circuits or intellectual property (IP) implemented with semiconductor elements in an integrated circuit.

According to the inventive concepts, a storage device performs state shaping on data such that the number of states expressed by the data decreases, and then writes the state shaped data in memory cells. Accordingly, even though the number of bits written in a single memory cell increases, there is provided a storage device that secures reliability.

While the inventive concepts have been described with reference to exemplary embodiments thereof, it should be apparent to one of ordinary skill in the art that various changes and modifications may be made thereto without departing from the spirit and scope of the inventive concepts as set forth in the following claims.

What is claimed is:

1. A storage device comprising:
a nonvolatile memory device including a plurality of pages, each of the plurality of pages including a plurality of memory cells; and
a controller configured to receive first write data expressed by $2^m$ states from an external host device,
wherein m is an integer greater than 1,
shape the first write data to second write data in a first operating mode, the second write data expressed by "k" states smaller in number than the $2^m$ states, wherein k is an integer greater than 2 and at least one of the $2^m$ states of the first write data is eliminated in the second write data,
perform first error correction encoding on the second write data to generate third write data expressed by the "k" states,
transmit the third write data to the nonvolatile memory device for writing at a selected page from the plurality of pages, and
store mapping information between patterns of the first write data and patterns of the second write data in a table, and shape the first write data to the second write data by using the table when the first write data are received.

2. The storage device of claim 1, wherein the controller is configured to shape "i" bits of the first write data to "j" bits of the second write data,
wherein i is an integer greater than 2, j is an integer greater than 2, and "j" is greater than "i".

3. The storage device of claim 1, wherein the second write data include a value expressed by n-ary numbers, and n is an integer greater than 2, and
wherein each of the n-ary numbers is expressed by two or more bits.

4. The storage device of claim 3, wherein in the second write data, at least one of combinations expressed by the two or more bits is eliminated.

5. The storage device of claim 1, wherein in the second write data and the third write data, at least one of combinations of two or more bits is eliminated.

6. The storage device of claim 1, wherein the controller further receives fourth write data together with the first write data, and the fourth write data include at least one page data expressed by at least two states at the plurality of memory cells, and
wherein the controller is further configured to perform second error correction encoding on the fourth write data to generate fifth write data, and transmit the fifth write data to the nonvolatile memory device for writing at the selected page together with the third write data.

7. The storage device of claim 6, wherein the fourth write data include four page data expressed by 16 states at the plurality of memory cells, "m" is 2, and the first write data and the fourth write data are expressed by 64 states, and
wherein "k" is 3 and the plurality of memory cells of the selected page where the third write data and the fifth write data are written have 48 states.

8. The storage device of claim 6, wherein the fourth write data include three page data expressed by 8 states at the plurality of memory cells, "m" is 2, and the first write data and the fourth write data are expressed by 32 states at the plurality of memory cells,
wherein the third write data are expressed by 3 states at the plurality of memory cells, and wherein the plurality of memory cells of the selected page where the third write data and the fifth write data are written have 24 states.

9. The storage device of claim 6, wherein the fourth write data include one page data expressed by 2 states at the plurality of memory cells, "m" is 3, and the first write data and the fourth write data are expressed by 16 states at the plurality of memory cells, wherein the third write data are expressed by 7 states at the plurality of memory cells, and wherein the plurality of memory cells of the selected page where the third write data and the fifth write data are written have 14 states.

10. The storage device of claim 6, wherein the fourth write data include one page data expressed by 2 states at the plurality of memory cells, "m" is 2, and the first write data and the fourth write data are expressed by 8 states at the plurality of memory cells, wherein the third write data are expressed by 3 states at the plurality of memory cells, and wherein the plurality of memory cells of the selected page where the third write data and the fifth write data are written have 6 states.

11. The storage device of claim 1, wherein "m" is 2, and the third write data are expressed by 3 states at the plurality of memory cells.

12. The storage device of claim 1, wherein "m" is 3, and the third write data are expressed by 7 states at the plurality of memory cells.

13. The storage device of claim 1, wherein in a second operating mode, the controller is configured to perform second error correction encoding on the first write data to generate fourth write data, and transmit the fourth write data to the nonvolatile memory device for writing in the selected page.

14. The storage device of claim 13, wherein in the first operating mode, the controller stores a flag indicating that the third write data are written through the first operating mode.

15. The storage device of claim 13, wherein first voltages used by the nonvolatile memory device to write the transmitted third write data in the first operating mode are different from second voltages used by the nonvolatile memory device to write the fourth write data in the second operating mode.

16. A storage device comprising:
a nonvolatile memory device including a plurality of pages, each of the plurality of pages including a plurality of memory cells; and
a controller configured to
receive a read request from an external host device,
read first read data expressed by "k" states from a selected page from the plurality of pages of the nonvolatile memory device in response to the read request, wherein k is an integer greater than 2,
perform error correction decoding on the first read data to generate second read data expressed by the "k" states,
shape the second read data to third read data expressed by $2^m$ states greater in number than the "k" states, wherein m is an integer greater than 1 and the third read data includes at least one state that is not included in the second read data,
output the third read data to the external host device, and
store mapping information between patterns of the second read data and patterns of the third read data in a table, and shape the second read data to the third read data by using the table.

17. The storage device of claim 16, wherein a number of bits of the second read data is more than a number of bits of the third read data.

18. A storage device comprising:
a nonvolatile memory device including a plurality of pages, each of the plurality of pages including a plurality of memory cells; and
a controller,
wherein the controller comprises
a host interface configured to receive first to sixth page data from an external host device,
a buffer configured to store the first to sixth page data transmitted from the host interface,
a binary error correction encoder configured to respectively perform error correction encoding on the first to fourth page data stored in the buffer to generate first to fourth encoded page data,
a shaping encoder configured to shape the fifth and sixth page data stored in the buffer to ternary data,
a ternary error correction encoder configured to perform ternary error correction encoding on the ternary data to generate ternary encoded data, and
a memory interface configured to transmit the first to fourth encoded page data and the ternary encoded data to the nonvolatile memory device,
wherein the nonvolatile memory device is configured to write the first to fourth encoded page data and the ternary encoded data at a selected page from the plurality of pages, and
the controller is further configured to store mapping information between patterns of the fifth and sixth page data and patterns of the ternary data in a table, and the shaping encoder shapes the fifth and sixth page data to the ternary data by using the table.

19. The storage device of claim 18, wherein the nonvolatile memory device is further configured to read the first to fourth encoded page data and the ternary encoded data written at the selected page, and transmit the read first to fourth encoded page data and the read ternary encoded data to the memory interface,
wherein the controller further comprises
a binary error correction decoder configured to perform error correction decoding on the read first to fourth encoded page data transmitted through the memory interface to restore the first to fourth page data,
a ternary error correction decoder configured to perform ternary error correction decoding on the read ternary encoded data transmitted through the memory interface to restore the ternary data, and
a shaping decoder configured to shape the restored ternary data transmitted from the ternary error correction decoder to the fifth page data and the sixth page data to provide restored fifth and sixth page data, and to store the restored fifth and sixth page data in the buffer.

* * * * *